(12) United States Patent
Kim et al.

(10) Patent No.: US 6,846,539 B2
(45) Date of Patent: Jan. 25, 2005

(54) LOW DEFECT DENSITY SILICON HAVING A VACANCY-DOMINATED CORE SUBSTANTIALLY FREE OF OXIDATION INDUCED STACKING FAULTS

(75) Inventors: Chang Bum Kim, St. Louis, MO (US); Steven L. Kimbel, St. Charles, MO (US); Jeffrey L. Libbert, O'Fallon, MO (US); Mohsen Banan, Grover, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 241 days.

(21) Appl. No.: 10/054,629

(22) Filed: Jan. 22, 2002

(65) Prior Publication Data

US 2002/0100410 A1 Aug. 1, 2002

Related U.S. Application Data

(60) Provisional application No. 60/264,415, filed on Jan. 26, 2001.

(51) Int. Cl.⁷ .......................... C30B 29/06; H01L 29/06
(52) U.S. Cl. ...................... 428/64.1; 428/446; 423/348; 117/928; 117/932
(58) Field of Search ............................... 428/64.1, 446; 423/348; 117/928, 932

(56) References Cited

U.S. PATENT DOCUMENTS

| 3,997,368 A | 12/1976 | Petroff et al. |
| 4,314,595 A | 2/1982 | Yamamoto et al. |
| 4,350,560 A | 9/1982 | Helgeland et al. |
| 4,981,549 A | 1/1991 | Yamashita et al. |

(List continued on next page.)

FOREIGN PATENT DOCUMENTS

| EP | 0 503 816 B1 | 9/1992 |
| EP | 0 504 837 A2 | 9/1992 |
| EP | 0 536 958 A1 | 4/1993 |
| EP | 0 909 840 | 4/1999 |
| EP | 0 962 556 A1 | 12/1999 |
| EP | 0 962 557 A1 | 12/1999 |
| EP | 0 990 718 | 5/2000 |
| GB | 2 137 524 A | 10/1984 |
| GB | 2 182 262 A | 5/1987 |

(List continued on next page.)

OTHER PUBLICATIONS

Abe, T., et al., "Swirl Defects in Float–Zoned Silicon Crystals," Physics., vol. 116B, (1985), pp. 139–147.

Abe, T., et al., "The Characteristics of Nitrogen in Silicon Crystals," VLSI Science and Technology/1985, (Electrochem. Soc. Pennington, 1985), Proceedings vol. 85–5, (1985), pp. 543–551.

(List continued on next page.)

Primary Examiner—Stephen Stein
(74) Attorney, Agent, or Firm—Senniger Powers

(57) ABSTRACT

The present invention relates to a process for preparing a single crystal silicon ingot, as well as to the ingot or wafer resulting therefrom. The process comprises controlling (i) a growth velocity, v, (ii) an average axial temperature gradient, $G_0$, and (iii) a cooling rate of the crystal from solidification to about 750° C., in order to cause the formation of a segment having a first axially symmetric region extending radially inward from the lateral surface of the ingot wherein silicon self-interstitials are the predominant intrinsic point defect, and a second axially symmetric region extending radially inward from the first and toward the central axis of the ingot. The process is characterized in that v, $G_0$ and the cooling rate are controlled to prevent the formation of agglomerated intrinsic point defects in the first region, while the cooling rate is further controlled to limit the formation of oxidation induced stacking faults in a wafer derived from this segment, upon subjecting the wafer to an oxidation treatment otherwise suitable for the formation of such faults.

30 Claims, 7 Drawing Sheets

U.S. PATENT DOCUMENTS

| | | |
|---|---|---|
| 5,264,189 A | 11/1993 | Yamashita et al. |
| 5,316,742 A | 5/1994 | Tomioka et al. |
| 5,441,014 A | 8/1995 | Tomioka et al. |
| 5,474,020 A | 12/1995 | Bell et al. |
| 5,485,803 A | 1/1996 | Habu |
| 5,487,354 A | 1/1996 | von Ammon et al. |
| 5,494,849 A | 2/1996 | Iyer et al. |
| 5,502,010 A | 3/1996 | Nadahara et al. |
| 5,567,399 A | 10/1996 | von Ammon et al. |
| 5,593,494 A | 1/1997 | Falster |
| 5,667,584 A | 9/1997 | Takano et al. |
| 5,704,973 A | 1/1998 | Sakurada et al. |
| 5,728,211 A | 3/1998 | Takano et al. |
| 5,789,309 A | 8/1998 | Hellwig |
| 5,846,322 A | 12/1998 | Schulmann et al. |
| 5,919,302 A | 7/1999 | Falster et al. |
| 5,935,320 A | 8/1999 | Graef et al. |
| 5,942,032 A | 8/1999 | Kim et al. |
| 5,954,873 A | 9/1999 | Hourai et al. |
| 5,958,133 A | 9/1999 | Boulaev et al. |
| 5,968,262 A | 10/1999 | Saishouji et al. |
| 5,968,264 A | 10/1999 | Iida et al. |
| 5,994,761 A | 11/1999 | Falster et al. |
| 6,045,610 A | 4/2000 | Park et al. |
| 6,048,395 A | 4/2000 | Iida et al. |
| 6,053,974 A | 4/2000 | Luter et al. |
| 6,066,366 A | 5/2000 | Berenbaum et al. |
| 6,093,913 A | 7/2000 | Schrenker et al. |
| 6,120,599 A | 9/2000 | Iida et al. |
| 6,153,008 A | 11/2000 | von Ammon et al. |
| 6,197,111 B1 | 3/2001 | Ferry et al. |
| 6,228,164 B1 | 5/2001 | Ammon et al. |
| 6,236,104 B1 | 5/2001 | Falster |
| 6,245,430 B1 | 6/2001 | Hourai et al. |
| 6,254,672 B1 | 7/2001 | Falster et al. |
| 6,312,516 B2 | 11/2001 | Falster et al. |
| 6,336,968 B1 | 1/2002 | Falster et al. |

FOREIGN PATENT DOCUMENTS

| | | |
|---|---|---|
| JP | 1145391 | 6/1989 |
| JP | 2-180789 | 7/1990 |
| JP | 2-267195 | 10/1990 |
| JP | Hei 3-93700 | 4/1991 |
| JP | 4-042893 | 2/1992 |
| JP | 4-108682 | 4/1992 |
| JP | 2528309 B2 | 8/1996 |
| JP | HO 8-268794 | 10/1996 |
| JP | 8-330316 | 12/1996 |
| JP | HO 9-202690 | 8/1997 |
| JP | 11043396 | 2/1999 |
| JP | 11-157995 A | 6/1999 |
| JP | 11-180800 A | 7/1999 |
| JP | 11-189495 A | 7/1999 |
| JP | 11-199386 A | 7/1999 |
| JP | 11-199387 A | 7/1999 |
| WO | WO 97/26393 | 7/1997 |
| WO | WO 98/45507 | 10/1998 |
| WO | WO 98/45508 | 10/1998 |
| WO | WO 98/45510 | 10/1998 |
| WO | WO 00/14776 | 3/2000 |
| WO | WO 00/22196 | 4/2000 |
| WO | WO 00/22198 | 4/2000 |
| WO | WO 01/21861 A1 | 3/2001 |
| WO | WO 01/21865 A1 | 3/2001 |

OTHER PUBLICATIONS

Abe, T., et al., "Behavior of Point Defects in FZ Silicon Crystals," Semiconductor Silicon 1990, *Proceedings of the Sixth International Symposium on Silicon Materials Science and Technolog*, vol. 90–7 (1990), pp. 105–116.

Abe, T., et al., "Dynamic Behavior of Intrinsic Point Defects in FZ and CZ Silicon Crystals," Mat. Res. Soc. Symp. Proc., vol. 262, (1992), pp. 3–13.

Abe, T., "The Formation Mechanism of Grown–In Defects in CZ Silicon Crystals Based on Thermal Gradients Measured by Thermocouples Near Growth Interfaces," Materials Science Engineering, vol. B73, (2000), pp. 16–29.

Borionetti, G., et al., "Investigation of Low Denisty Defects in Czochralski Silicon Crystals: Their Detectability, Formation Kinetics and Influence on Gate Oxide Integrity," Electrochemical Society Proceedings, vol. 96–13, pp. 160–169.

De Kock, A.J.R., "Microdefects in Swirl–Free Silicon Crystals," pp. 83–94 (source unknown) (date unknown).

De Kock, A.J.R.,"The Elimination of Vacancy–Cluster Formation in Dislocation –Free Silicon Crystals," J. of the Electrochem. Soc.: Solid–State Science and Technology, vol. 118, No. 11, (Nov. 1971), pp. 1851–1856.

De Kock, A.J.R., et al., "Effect of Growth Parameters on Formation and Elimination of Vacancy Clusters in Dislocation–Free Silicon Crystals," Journal of Crystal Growth, vol. 22 (1974), pp. 311–320.

De Kock, A.J.R., "Point Defect Condensation in Dislocation–Free Silicon Crystals", Semiconductor Silicon, 1977, pp. 508–520.

De Kock, A.J.R, et al., "The Effect of Doping on the Formation of Swirl Defects in Dislocation–Free Czochralski–Grown Silicon Crystals," Journal of Crystal Growth, vol. 49, (1980) pp. 718–734.

Dornberger, E., et al., "The Impact of Dwell Time Above 900° C. During Crystal Growth on the Gate Oxide Integrity of Silicon Wafers," Electrochemical Society Proceedings, vol. 96, No. 13, pp. 140–151.

Dornberger, E., et al., "The Dependence of Ring Like Distributed Stacking Faults on the Axial Temperature Gradient of Growing Czochralski Silicon Crystals," Electrochemical Society Proceedings, vol. 95–4, (May, 1995) pp. 294–305.

Dornberger, E., et al., "Simulation of Grown–In Voids in Czochralski Silicon Crystals," Electrochemical Society Proceedings, vol. 97–22, pp. 40–49.

Dornberger, E., et al., "Simulation of Non–Uniform Grown–In Void Distributions in Czochralski Silicon Crystals," Electrochemical Society Proceedings, vol. 98, vol. 1, pp. 490–503.

Dornberger, E., et al., "Defects in As–Grown Silicon and Their Evolution During Heat Treatments," Material Science Forum, 1997, vols. 258–263, pp. 341–346.

Eidenzon, A.M., et al., "Classification of Grown–In Microdefects in Czochralski–Grown Silicon Crystals," Inoranic Materials, vol. 31(4), 1994, pp. 401–409.

Eidenzon, A.M., et al., "Defect–Free Silicon Crystals Grown By The Czochralski Technique," Inorganic Materials, vol. 33, No. 3, (1997) pp. 219–225.

Eidenzon, A.M., et al., "Influence Of Growth Rate On Swirl Defects In Large Dislocation–Free Crystals Of Silicon Grown By The Czochralski Method," Sov. Phys. Crystallogr.; vol. 30 , No. 5 (1985) pp. 576–580.

Faslter, R., et al., "Intrinsic Point–Defects and Reactions in the Growth of Large Silicon Crystals," Electrochemical Society Proceedings, vol. 98–1, pp. 468–489.

Falster, R., et al., "Intrinsic Point Defects and Their Control in Silicon Crystal Growth and Wafer Processing," vol. 25(6), (2000), pp. 28–32.

Falster, R., et al., "On the Properties of the Intrinsic Point Defects in Silicon: A Perspective from Crystal Growth and Wafer Processing," vol. 222(1), (2000), pp. 219–244.

Foll, H., et al. "The Formation of Swirl Defects in Silicon by Agglomeration of Self–Interstitials," Journal of Crystal Growth, 1977, pp. 90–1087, vol. 40, North–Holland Publishing Company.

Harada, H., et al., Oxygen Precipitation Enhanced with Vacancies in Silicon, pp. 76–85.

Hourai, M., et al., "Nature and Generation of Grown–In Defects in Czochralski Silicon Crystals," Electrochemical Society Proceedings, vol., 98–1, pp. 453–467.

Hourai, M., et al., "Improvement of Gate Oxide Integrity Characteristics of CZ–Grown Silicon Crystals," Progress in Semiconductor Fabrication presented by: Semiconductor Equipment and Materials International, Semicon/Europa 93, Mar. 30–Apr. 1, 1993, Geneva, Switzerland.

Hourai, M., et al. "Growth Parameters Determining the Type of Grown–In Defects in Czockralski Silicon Crystals," Materials Science Forum, vols. 196–201 (1995) pp. 1713–1718.

Hourai, M., et al., "Formation Behavior of Infrared Light Scattering Defects in Silicon During Czochralski Crystal Growth," J. Electrochem. Soc., vol. 142(9), (1995), 3193–3201.

Kissinger, G., et al. "A Method for Studying the Grown–In Defect Density Spectra in Czochralski Silicon Wafers," Journal of Electrochemical Society, vol. 144, No. 4, (1997) pp. 1447–1456.

Kitano, et al., "Identification of Vacancy Clusters in FZ–SI Crystals," Phys. Stat. Sol, vol. 127(a), (1991), 341–347.

Lemke, H., et al., "Analytical Approximations for the Distributions of Intrinsic Point Defects in Grown Silicon Crystals," Phys. Stat. Sol. (a) vol. 176 (1999), pp. 843–865.

Nakamura, K., et al., "Formation Process of Grown–In Defects in Czochralski Grown Silicon Crystals," Journal of Crystal Growth, vol. 180, (1997) pp. 61–72.

Park, J.G., et al., "Effect of Crystal Defects on Device Characteristics", *Proceedings of the Symposium on* Crystalline Defects and Contamination: Their Impact And Control In Device Manufacturing II, Proceed. vol. 97–22 (1997), pp. 173–195.

Puzanov, N.I., et al., "Influence of Transitional Crystallization Regimes on Microdefects in Silicon," USSR Academy of Sciences Newsletter, vol. 22, No. 8 (1986), pp. 1237–1242.

Puzanov, N.I.,et al., "Relaxation In A System Of Point Defects In A Growing Dislocation–Free Crystal Of Silicon," Sov. Phys. Crystallogr., vol. 31, No. 2, (1986) pp. 219–222.

Puzanov, N.I., et al., "Microdefects in Silicon Grown by the Czochralski Method with a Vertical Magnetic Field Acting on the Melt," Sov. Phys. Crystallogr. 35(1), (1990), pp. 102–105.

Puzanov, N.I., et al., "Influence of Growth Conditions on the Formation of Microdefects in Dislocation–Free Silicon," Sov. Phsys. Crystallogr., vol. 34(2), (1989) pp. 273–278.

Puzanov, N.I., et al., "The effect of thermal history during crystal growth on oxygen precipitation in Czochralski–grown silicon," Semicond. Sci. Technol., vol. 7, (1992), pp. 406–413.

Puzanov, N.I., et al., "Formation of the bands of anomalous oxygen precipitation in Czochralski–grown Si crystals," Journal of Crystal Growth vol. 137, (1994), pp. 642–652.

Puzanov, N.I., et al., "Modeling Point–Defect Distribution in Dislocation–Free Si Crystals Grown from the Melt," Inorganic Materials, Vo. 32(1), (1996), pp. 1–9.

Puzanov, N.I., et al., "The Role of Intrinsic Point Defects in the Formation of Oxygen Precipitation Centers in Dislocation–Free Silicon," Crystallography Reports, vol. 41, No. 1, (1996), pp. 134–141.

Puzanov, N.I., et al., "Cultivation, Morphology and Structural Integrity of Dislocation–Free Silicon Tetracrystals," Inorganic Materials, vol. 32, No. 8 (1996), pp. 903–912.

Puzanov, N.I., et al., "Harmful Microdefects in the Seed–End Portion of Large–Diameter Silicon Ingots," Inorganic Materials, vol. 33, No. 8, (1997) pp. 765–769.

Puzanov, N.I., et al., "Modelling microdefect distribution in dislocation–free Si crystals grown from the melt," Journal of Crystal Growth, 178, (1997), pp. 468–478.

Puzanov, N.I., et al., "Role of Vacancies in the Nucleation of Ringlike–patterned Oxidation–induced Stacking Faults in Melt–grown Silicon Crystals," Inorganic Materials, vol. 34–4, (1998) pp. 307–314.

Roksnoer, P.J., "Effect of Low Cooling Rates on Swirls and Striations in Dislocation–Free Silicon Crystals," vol. 35, (1976), pp. 245–248.

Roksnoer, P.J., "Microdefects in a Non–Striated Distribution in Floating–Zone Silicon Crystals," Journal of Crystal Growth, vol. 53 (1981), pp. 563–573.

Roksnoer, P.J., "The Mechanism of Formation of Microdefects in Silicon," Journal of Crystal Growth, vol. 68 (1984), pp. 596–612.

Ryuta, J. et al., "Crystal–Originated Singularities on Si Wafer Surface after SC1 Cleaning," Japanese Journal of Applied Physics, vol. 29(11) (1990), pp. L1947–L1949.

Seidel, T.E., "Silicon Wafers for the 1990's," Journal of Crystal Growth, vol. 85, (1987), pp. 97–105.

Shimanuki, Y., et al., "Effects of Thermal History on Microdefect Formation in Czochralski Silicon Crystals," Japanese Journal of Applied Physics, vol. 24, No. 12, (1985), pp. 1594–1599.

Sinno, T., et al., "On the Dynamics of the Oxidation–Induced Stacking–Fault Ring in as–grown Czochralski silicon crystals," Applied Physics Letters, vol. 70, No. 17, (1997) pp. 2250–2252.

Sinno, T., et al., "Point Defect Dynamics and the Oxidation–Induced Stacking–Fault Ring in Czochralski–Grown Silicon Crystals," J. Electrochem. Soc., vol. 145, No. 1, (1998) pp. 302–318.

Tan, T. Y., "Point Defects, Diffusion Processes, and Swirl Defect Formation in Silicon," Appl. Phys. A., vol. 37, (1985) pp. 1–17.

Vanhellemont , J., et al., "Defects in As–Grown Silicon and Their Evolution During Heat Treatments," Materials Science Forum, vols. 258–263, (1997) pp. 341–346.

Virzi, "Computer Modelling of Heat Transfer in Czochralski Silicon Crystal Growth," Journal of Crystal Growth, 1991, vol. 112, pp. 699–722.

Von Ammon, W., et al. "The Dependence of bulk defects on the axial temperature gradient of silicon crystals during Czochralski growth," Journal of Crystal Growth, vol. 151 (1995) pp. 273–277.

Von Ammon, W., et al. "Bulk properties of very large diameter silicon single crystals," Journal of Crystal Growth, vol. 198/199, (1999), pp. 390–398.

Voronkov,V., "The Mechanism of Swirl Defects Formation in Silicon", Journal of Crystal Growth, vol. 59 (1982) pp. 625–643.

Voronkov, V., et al., "Behavior and Effects of Intrinsic Point Defects in the Growth of Large Silicon Crystals", Electrochemical Society proceedings, vol. 97–22, (Aug. 1997), pp. 3–17.

Voronkov, V.V., et al., "Vacancy–type microdefect formation in Czochralski silicon", Journal of Crystal Growth 194 (1998) 76–88.

Voronkov, V., et al., "Vacancy and Self–Interstitial Concentration Incorporated into Growing Silicon Crystals," Journal of Applied Physics, vol., 86(11), 1999, 5975–5982.

Voronkov, V., et al., "Grown–in microdefects, residual vacancies and oxygen precipitation banks in Czochralski silicon" Journal of Crystal Growth, 304 (1999) pp. 462–474.

Wijaranakula, W., "Numerical Modeling of the Point Defect Aggregation during the Czochralski Silicon Crystal Growth", Journal of Electrochemical Society, vol. 139, No. 2 (Feb. 1992), pp. 604–616.

Wijaranakula, W., "Effect of High–Temperature Annealing on the Dissolution of the D–Defects in N–Type Czochralski Silicon," Appl. Phys. Lett., vol. 64(8), (1994), 1030–1032.

Winkler, R., et al. "Improvement of the Gate Oxide Integrity by Modifying Crystal Pulling and its Impact on Device Failures" Journal of the Electrochemical Society, vol. 141, No. 5 (May/1994) pp. 1398–1401.

Yamagishi, et al., "Recognition of D Defects in Silicon Signle Crystals by Preferential Etching and Effect on Gate Oxide Integrity", Semicond. Sci Technol. 7, 1992, A135–A140.

Yamauchi, T., et al., "Application of Copper–Decoration Method to Characterize As–Grown Czochralski–Silicon," Jpn. J. Appl. Phys., vol. 31, (1992), pp L439–L442.

Zimmerman, H., et al. "Gold and Platinum Diffusion: the Key to the Understanding of Intrinsic Point Defect Behavior in Silicon", Applied Physics A Solids and Surfaces, vol. A55, No. 1 (1992) pp. 121–134.

Zimmerman, H., et al. "Vacancy concentration wafer mapping in silicon" Journal of Crystal Growth, vol. 129, (1993) pp. 582–592.

International Search Report, PCT/US 02/01782 dated Sep. 20, 2002.

LOW DEFECT DENSITY SILICON HAVING A VACANCY-DOMINATED CORE SUBSTANTIALLY FREE OF OXIDATION INDUCED STACKING FAULTS

REFERENCE TO RELATED APPLICATION

This application claims priority from U.S. provisional application, U.S. Serial No. 60/264,415, filed on Jan. 26, 2001.

BACKGROUND OF THE INVENTION

The present invention generally relates to the preparation of semiconductor grade single crystal silicon which is used in the manufacture of electronic components. More particularly, the present invention relates to single crystal silicon ingots and wafers, as well as a process for the preparation thereof, having (i) an outer, axially symmetric region wherein silicon interstitials are the predominant intrinsic point defect and which is devoid of agglomerated intrinsic point defects, surrounding (ii) an inner, axially symmetric region wherein silicon lattice vacancies are the predominant intrinsic point defect and which is substantially free of nuclei which lead to the formation of oxidation induced stacking faults.

Single crystal silicon, which is the starting material in most processes for the fabrication of semiconductor electronic components, is commonly prepared by the so-called Czochralski ("Cz") method. In this method, polycrystalline silicon ("polysilicon") is charged to a crucible and melted, a seed crystal is brought into contact with the molten silicon and a single crystal is grown by slow extraction. After formation of a neck is complete, the diameter of the crystal is enlarged by, for example, decreasing the pulling rate and/or the melt temperature until the desired or target diameter is reached. The cylindrical main body of the crystal which has an approximately constant diameter is then grown by controlling the pull rate and the melt temperature while compensating for the decreasing melt level. Near the end of the growth process but before the crucible is emptied of molten silicon, the crystal diameter must be reduced gradually to form an end-cone. Typically, the end-cone is formed by increasing the crystal pull rate and heat supplied to the crucible. When the diameter becomes small enough, the crystal is then separated from the melt.

It is now recognized that a number of defects in single crystal silicon form in the growth chamber as the ingot cools from the temperature of solidification. More specifically, as the ingot cools intrinsic point defects, such as crystal lattice vacancies or silicon self-interstitials, remain soluble in the silicon lattice until some threshold temperature is reached, below which the given concentration of intrinsic point defects becomes critically supersaturated. Upon cooling to below this threshold temperature, a reaction or agglomeration event occurs, resulting in the formation of agglomerated intrinsic point defects.

As has been reported elsewhere (see, e.g., U.S. Pat. Nos. 5,919,302 and 6,254,672, as well as PCT/US98/07365 and PCT/US98/07304, all of which are incorporated in their entirety herein by reference), the type and initial concentration of these point defects in the silicon are determined as the ingot cools from the temperature of solidification (i.e., about 1410° C.) to a temperature greater than about 1300° C. (i.e., about 1325° C., 1350° C. or more); that is, the type and initial concentration of these defects are controlled by the ratio $v/G_0$, where v is the growth velocity and $G_0$ is the average axial temperature gradient over this temperature range. Specifically, for increasing values of $v/G_0$, a transition from decreasingly self-interstitial dominated growth to increasingly vacancy dominated growth occurs near a critical value of $v/G_0$ which, based upon currently available information, appears to be about $2.1 \times 10^{-5}$ cm$^2$/sK, where $G_0$ is determined under conditions in which the axial temperature gradient is constant within the temperature range defined above. Accordingly, process conditions, such as growth rate (which affect v), as well as hot zone configurations (which affect $G_0$), can be controlled to determine whether the intrinsic point defects within the single crystal silicon will be predominantly vacancies (where $v/G_0$ is generally greater than the critical value) or self-interstitials (where $v/G_0$ is generally less than the critical value).

Defects associated with the agglomeration of crystal lattice vacancies, or vacancy intrinsic point defects, include such observable crystal defects as D-defects, Flow Pattern Defects (FPDs), Gate Oxide Integrity (GOI) Defects, Crystal Originated Particle (COP) Defects, and crystal originated Light Point Defects (LPDs), as well as certain classes of bulk defects observed by infrared light scattering techniques (such as Scanning Infrared Microscopy and Laser Scanning Tomography).

Also present in regions of excess vacancies, or regions where some concentration of free vacancies are present but where agglomeration has not occurred, are defects which act as the nuclei for the formation of oxidation induced stacking faults (OISF). It is speculated that this particular defect, generally formed proximate the boundary between interstitial and vacancy dominated material, is a high temperature nucleated oxygen precipitate catalyzed by the presence of excess vacancies; that is, it is speculated that this defect results from an interaction between oxygen and "free" vacancies in a region near the V/I boundary.

Defects relating to self-interstitials are less well studied. They are generally regarded as being low densities of interstitial-type dislocation loops or networks. Such defects are not responsible for gate oxide integrity failures, an important wafer performance criterion, but they are widely recognized to be the cause of other types of device failures usually associated with current leakage problems.

The density of such vacancy and self-interstitial agglomerated defects in Czochralski silicon is conventionally within the range of about $1 \times 10^3$/cm$^3$ to about $1 \times 10^7$/cm$^3$. While these values are relatively low, agglomerated intrinsic point defects are of rapidly increasing importance to device manufacturers and, in fact, are now seen as yield-limiting factors in device fabrication processes.

Agglomerated defect formation generally occurs in two steps; first, defect "nucleation" occurs, which is the result of the intrinsic point defects being supersaturated at a given temperature. Once this "nucleation threshold" temperature is reached, intrinsic point defects agglomerate. The intrinsic point defects will continue to diffuse through the silicon lattice as long as the temperature of the portion of the ingot in which they are present remains above a second threshold temperature (i.e., a "diffusivity threshold"), below which intrinsic point defects are no longer mobile within commercially practical periods of time. While the ingot remains above this temperature, vacancy or interstitial intrinsic point defects diffuse through the crystal lattice to sites where agglomerated vacancy defects or interstitial defects, respectively, are already present, causing a given agglomerated defect to grow in size. Growth occurs because these agglomerated defect sites essentially act as "sinks," attracting and collecting intrinsic point defects because of the more favorable energy state of the agglomeration.

Accordingly, the formation and size of agglomerated defects are dependent upon the growth conditions, including $v/G_0$ (which impacts the initial concentration of such point defects), as well as the cooling rate or residence time of the main body of the ingot over the range of temperatures bound by the "nucleation threshold" at the upper end and the "diffusivity threshold" (which impacts the size and density of such defects) at the lower end. As has been previously reported (see, e.g., U.S. Pat. No. 6,312,516 and PCT Patent Application Serial No. PCT/US99/14287, both of which are incorporated in their entirety herein by reference), control of the cooling rate or residence time enables the formation of agglomerated intrinsic point defects to be suppressed over much larger ranges of values for $v/G_0$; that is, controlled cooling allows for a much larger "window" of acceptable $v/G_0$ values to be employed while still enabling the growth of substantially defect-free silicon.

It is to be noted, however, that in addition to the formation of agglomerated intrinsic point defects the formation of oxygen precipitate-related defects, such as oxidation induced stacking faults, are also of concern. More specifically, it is to be noted that in addition to the diffusion of intrinsic point defects, when present oxygen can also diffuse through the crystal lattice. If the oxygen concentration is sufficiently high, the formation of oxygen precipitate nucleation centers, as well as oxygen precipitates, can also occur. Silicon wafers, derived from silicon ingots containing such nucleation centers or precipitates, can be problematic for integrated circuit manufactures, because they can lead to oxygen-related defects, such as oxidation induced stacking faults, upon exposure to the thermal conditions of a manufacturing process.

Accordingly, it is desirable to have a single crystal silicon growth process which enables both the control of agglomerated intrinsic point defects as well as the control of oxygen precipitate nucleation centers or oxygen precipitates, particularly those leading to the formation of oxidation induced stacking faults. Such a process would be especially beneficial when growth of medium to high oxygen content silicon (e.g., about 14 to 18 PPMA oxygen content), is needed.

SUMMARY OF THE INVENTION

Among the features of the present invention, therefore, is the provision of single crystal silicon, in ingot or wafer form, having an axially symmetric region extending radially inward from the lateral surface of the ingot or circumferential edge of the wafer, of a substantial radial width, wherein silicon self-interstitials are the predominant intrinsic point defect and which is substantially free of agglomerated intrinsic point defects; the provision of such a single crystal silicon ingot or wafer having another axially symmetric region, extending radially inward from the interstitial-dominated region, wherein crystal lattice vacancies are the predominant intrinsic point defect and which has a significantly reduced concentration of, and can be substantially free of, nuclei which lead to the formation of oxidation induced stacking faults; the provision of such a single crystal silicon ingot or wafer wherein the vacancy-dominated, axially symmetric region is also substantially free of agglomerated defects; and, the provision of such a single crystal silicon ingot or wafer having a medium to high oxygen content.

Further among the features of the present invention is the provision of a process, as well as an apparatus, for preparing such a single crystal silicon ingot, in which the concentration of self-interstitials is controlled in order to prevent the agglomeration of intrinsic point defects in an axially symmetric region extending radially inward from the lateral surface of the constant diameter portion of the ingot, as the ingot cools from the solidification temperature; the provision of such a process wherein controlled cooling is further employed to prevent the formation of nuclei which lead to the formation of oxidation induced stacking faults in a vacancy-dominated, axially symmetric region which extends radially inward from the interstitial-dominated region; the provision of such a process wherein the vacancy-dominated, axially symmetric region is substantially free of agglomerated defects; the provision of such a process wherein such an ingot is prepared by quench cooling through a temperature range wherein the nucleation of both interstitial agglomerated defects and oxidation induced stacking fault nuclei occur, and optionally wherein the nucleation of vacancy agglomerated defects occurs.

Briefly, therefore, the present invention is directed to a process for growing a single crystal silicon ingot in which the ingot comprises a central axis, a seed-cone, a tail-end and a constant diameter portion between the seed-cone and the tail-end having a lateral surface, a radius extending from the central axis to the lateral surface, the ingot being grown from a silicon melt and then cooled from the solidification temperature in accordance with the Czochralski method. The process comprises controlling: (i) a growth velocity, v, (ii) an average axial temperature gradient, $G_0$, during the growth of the constant diameter portion of the crystal over the temperature range from solidification to a temperature of no less than about 1325° C., and (iii) the cooling rate of the crystal from the solidification temperature to about 750° C., to cause the formation of a segment wherein an interstitial-dominated, axially symmetric region which is substantially free of type A agglomerated defects extends radially inward from the circumferential edge, wherein a vacancy-dominated, axially symmetric region extends radially inward from the interstitial-dominated region, and further wherein a wafer obtain from said segment, upon being subjected to an oxidation treatment, has an oxidation induced stacking fault concentration of less than about 50/cm².

The present invention is further directed to a process for growing a single crystal silicon ingot in which the ingot comprises a central axis, a seed-cone, a tail-end and a constant diameter portion between the seed-cone and the tail-end, the constant diameter portion having a lateral surface and a radius extending from the central axis to the lateral surface, the ingot being grown from a silicon melt in accordance with the Czochralski method. The process comprises: cooling the ingot from the temperature of solidification to a temperature of less than about 750° C. and, as part of said cooling step, quench cooling a segment of the constant diameter portion of the ingot through a temperature of nucleation for the agglomeration of silicon self-interstitials and oxygen precipitates, to obtain in said segment an interstitial-dominated, axially symmetric region extending radially inward from the lateral surface and a vacancy-dominated, axially symmetric region extending radially inward from said interstitial-dominated region, wherein said interstitial-dominated region is substantially free of type A agglomerated defects, and further wherein a wafer obtain from said segment, upon being subjected to an oxidation treatment, has an oxidation induced stacking fault concentration of less than about 50/cm².

The present invention is still further directed to a process, as described above, wherein thermal annealing is employed, prior to said oxidation step, in order to dissolve nuclei present which would otherwise lead to the formation of oxidation induced stacking faults.

The present invention is still further directed to a single crystal silicon wafer having a central axis, a front side and a back side which are generally perpendicular to the axis, a circumferential edge, and a radius extending from the central axis to the circumferential edge of the wafer. The wafer comprises: (i) an interstitial-dominated, axially symmetric region extending radially inward from the circumferential edge which is substantially free of A type agglomerated interstitial defects; and, (ii) a vacancy-dominated, axially symmetric region extending radially inward from the interstitial-dominated region wherein, upon being subjected to an oxidation treatment, an oxidation induced stacking fault concentration is less than about 50/cm².

The present invention is still further directed to a single crystal silicon ingot having a segment therein of a substantial axial length. The ingot segment comprises: (i) an interstitial-dominated, axially symmetric region extending radially inward from a lateral surface of the segment which is substantially free of A type agglomerated interstitial defects; and, (ii) a vacancy-dominated, axially symmetric region extending radially inward from the interstitial-dominated region wherein a wafer, obtained from the segment, upon being subjected to an oxidation treatment, has an oxidation induced stacking fault concentration is less than about 50/cm².

The present invention is still further directed to a single crystal silicon ingot, or ingot segment, as well as a wafer obtained therefrom, wherein the vacancy-dominated, axially symmetric region is substantially free of agglomerated vacancy defects.

The present invention is still further directed to a crystal puller for producing a single crystal silicon ingot as described herein. The crystal puller comprises: (i) a crucible for holding molten semiconductor source material; (ii) a heater in thermal communication with the crucible for heating the crucible to a temperature sufficient to melt the semiconductor source material held by the crucible; (iii) a pulling mechanism positioned above the crucible for pulling the ingot from the molten material held by the crucible; (iv) a heat shield assembly disposed above the molten source material held by the crucible, the heat shield assembly having a central opening sized and shaped for surrounding the ingot as the ingot is pulled from the molten material, said heat shield assembly being generally interposed between the ingot and the crucible as the ingot is pulled upward from the source material within the crystal puller; and (v) a cooling system disposed in the crystal puller above the heat shield assembly for further cooling the ingot as the ingot is pulled upward within the crystal puller above the heat shield assembly, the cooling system having a central opening sized and shaped for surrounding the ingot as the ingot is pulled upward within the crystal puller.

Other objects and features of this invention will be in part apparent and in part pointed out hereinafter.

BRIEF DESCRIPTION OF THE DRAWINGS

With respect to the Figures, corresponding reference characters indicate corresponding parts throughout the several views of the drawings.

DETAILED DESCRIPTION OF THE PREFERRED EMBODIMENTS

Figure 1:
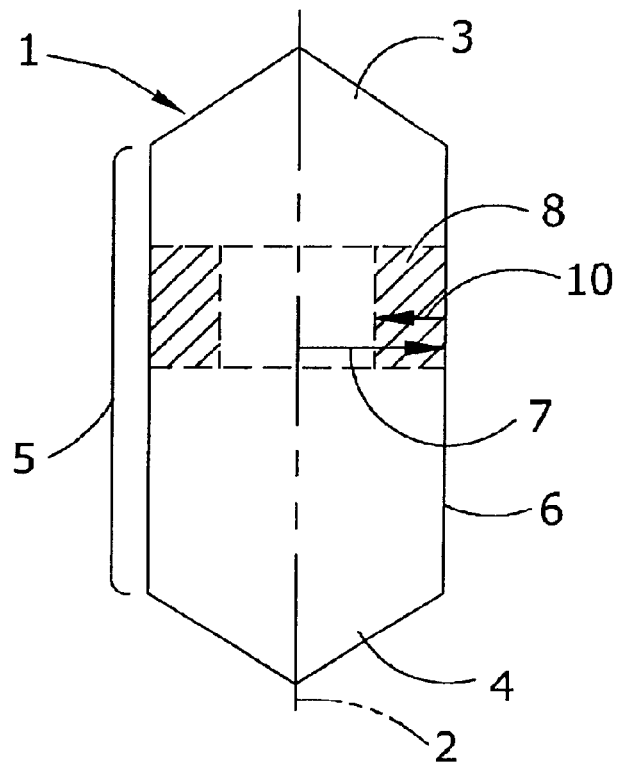
FIG. 1 is a longitudinal, cross-sectional view of a single crystal silicon ingot showing, in detail, an axially symmetric region of a constant diameter portion of the ingot.

In accordance with the present invention, it has been discovered that controlled cooling may be utilized in the preparation of a single crystal silicon ingot having an interstitial-dominated, axially symmetric region extending radially inward from the lateral surface of the ingot which is substantially free of agglomerated intrinsic point defects, in order to limit, and preferably substantially prevent, the formation of nuclei which lead to the formation of oxidation induced stacking faults in a vacancy-dominated, axially symmetric region extending radially inward from the interstitial-dominated region. More specifically, as further described herein, it has been discovered that, by combining the control of the ratio $v/G_0$, wherein v is the growth velocity and $G_0$ is the average axial temperature gradient, during the growth of the constant diameter portion of the crystal over the temperature range from solidification to a temperature greater than about 1300° C. (e.g., 1325° C., 1350° C. or more), with control of the cooling rate of the ingot through a temperature range, or ranges, (i) wherein nucleation of agglomerated interstitial intrinsic point defects and nuclei which lead to the formation of oxidation induced stacking faults occurs, and (ii) wherein interstitial point defects and oxygen are mobile, the formation of interstitial agglomerated defects and such oxidation induced stacking fault nuclei can be prevented in a segment of the single crystal silicon ingot (and thus in silicon wafers derived therefrom). The present process may be further employed to prevent the formation of agglomerated defects in a vacancy-dominated region or core, as well.

Interstitial-Dominated,
Axially Symmetric Region:
Radial Width/Axial Length

Previously, it has been reported that process conditions can be controlled during growth of a single crystal silicon ingot, prepared in accordance with the Czochralski method, such that the constant diameter portion of the ingot contains a region or segment which is substantially free of agglomerated intrinsic point defects. (See, e.g., U.S. Pat. Nos. 5,919,302 and 6,254,672, as well as PCT Patent Application Serial Nos. PCT/US98/07365 and PCT/US98/07304, all of which are incorporated herein by reference.) As disclosed therein, growth conditions, including growth velocity, v, the average axial temperature gradient, $G_0$, between the temperature of solidification and a temperature greater than about 1300° C., and the cooling rate from solidification to a temperature at which silicon self-interstitial point defects are essentially no longer mobile within a commercially practical period of time (e.g., less than about 1100° C., 1050° C., 1000° C., 900° C., 800° C.), are controlled to cause the formation of an interstitial-dominated, axially symmetric region extending radially inward from the lateral surface of the constant diameter portion of the ingot, which is substantially free of agglomerated intrinsic point defects.

These growth conditions can in some cases be controlled to maximize the volume of this axially symmetric region relative to the volume of the constant diameter portion of the ingot (e.g., having a radius about equal to the radius of the ingot). However, in some instances, this interstitial-dominated, axially symmetric region has some radial width which is less than the radius of the ingot. For example, the axially symmetric region can have a width equal to about 10% or 20% of the radius of the ingot, with widths of about 30%, 40%, 60%, 80%, 90% or even about 95% being possible. Furthermore, this axially symmetric region can extend over a length of at least about 10% or 20% of the constant diameter portion of the ingot, with lengths of at least about 30%, 40%, 60%, 80%, 90%, 95% or even about 100% being possible.

Control of $V/G_0$ and Cooling Rate

As described in the above-cited references, it is generally believed that the formation of such an axially symmetric region is achieved as a result of suppressing the reactions in which silicon self-interstitial (or in some cases crystal lattice vacancy) intrinsic point defects react to produce agglomerated intrinsic point defects. This suppression is achieved by controlling the concentration of these intrinsic point defects in this axially symmetric region during the growth and cooling of the ingot to ensure this region never become critically supersaturated. Preventing critical supersaturation, or the agglomeration of intrinsic point defects, can be achieved by establishing an initial concentration (controlled by $v/G_0(r)$, where $G_0$ is a function of radius) which is sufficiently low such that critical supersaturation is never achieved. Such an approach requires that the actual value of $v/G_0$ be maintained within a narrow target range of values very close to the critical value of $v/G_0$.

However, it has been found that due to the relatively large mobility of self-interstitials, which is generally about $10^{-4}$ cm$^2$/second, it is possible to effectively suppress the concentration of intrinsic point defects over relatively large distances (i.e., distances of about 5 cm to about 10 cm or more), by the radial diffusion of self-interstitials to sinks located at the crystal surface or to vacancy dominated regions located within the crystal. Radial diffusion can be effectively used to suppress the concentration of self-interstitials (and in some cases vacancies), provided sufficient time is allowed for the radial diffusion of the initial concentration of intrinsic point defects. In general, the diffusion time will depend upon the radial variation in the initial concentration of intrinsic point defects, with lesser radial variations requiring shorter diffusion times.

Such radial diffusion can be achieved by means of controlled cooling. As a result, controlled cooling can be employed to increase the residence time of a given segment of the ingot in a temperature range at which intrinsic point defects, such as interstitials, are mobile in order to allow more time for the point defects to diffuse to a site where they can be annihilated. As further described in, for example, U.S. Pat. No. 6,312,516 or PCT Patent Application Serial No. PCT/US99/14287 (both of which are incorporated herein by reference), controlled cooling can employed to significantly expand the range of values for $v/G_0$ which can be used while still avoiding the formation of agglomerated defects.

Figure 2:
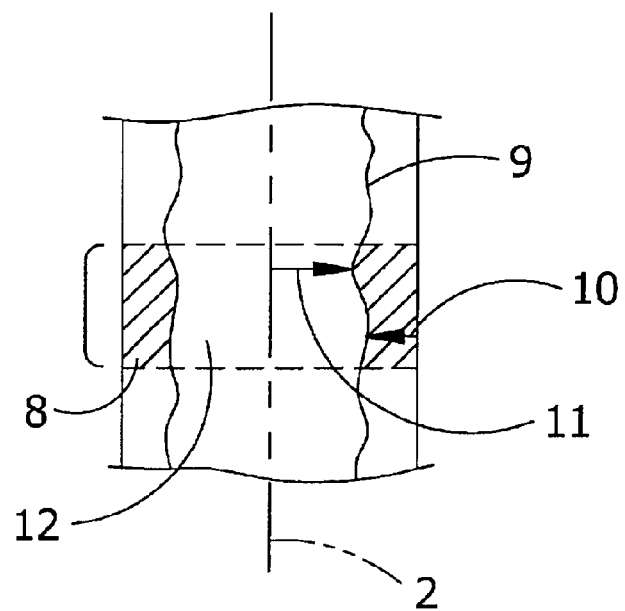
FIG. 2 is a longitudinal, cross-sectional view of a segment of a constant diameter portion of a single crystal silicon ingot, showing in detail axial variations in the width of an axially symmetric region.

Referring now to FIGS. 1 and 2, in the process of the present invention a single crystal silicon ingot 1 is grown in accordance with the Czochralski method. The silicon ingot comprises a central axis 2, a seed-cone 3, a tail-end or end-cone 4 and a constant diameter portion 5 between the seed-cone and the end-cone. The constant diameter portion has a lateral surface or circumferential edge 6 and a radius 7 extending from the central axis to the surface 6. The present process comprises controlling the growth conditions, including growth velocity, v, the average axial temperature gradient, $G_0$, and the cooling rate, to cause the formation of an interstitial-dominated, outer axially symmetric region 8 which, upon cooling of the ingot from the solidification temperature, is substantially free of agglomerated intrinsic point defects.

In the present invention, growth conditions are controlled such that a V/I boundary 9 is present at some position along the radius of the ingot. The relative position of this boundary will determine a width 10 of the interstitial-dominated, axially symmetric region 8, and a width 11 of a vacancy-dominated, axially symmetric region 12, relative to the volume of the constant diameter portion 5 of the ingot 1. The axially symmetric region 8 has a width typically equal to at least about 10% or 20% of the radius of the ingot, with widths of about 30%, 40%, 60%, 80%, 90% or even about 95% being possible, the remaining portion of the ingot segment comprising the vacancy-dominated, axially symmetric region or cylindrical core 12. Furthermore, as described above, the segment of the ingot which comprises these two axially symmetric regions can extend over a length of at least about 10% or 20% of the constant diameter portion of the ingot, with lengths of at least about 30%, 40%, 60%, 80%, 90%, 95% or even about 100% being possible.

It is to be noted that the width of axially symmetric regions 8 and 12 may have some variation along the length of the central axis 2. For an axially symmetric region of a given length, therefore, the width of axially symmetric region 8 is determined by measuring the distance from the lateral surface 6 of the ingot 1 radially toward a point which is farthest from the central axis. In other words, the width 10 is measured such that the minimum distance within the given length of the axially symmetric region 8 is determined. Similarly, the width 11 of axially symmetric region 12 is determined by measuring the distance from the V/I boundary 9 radially toward a point which is closest to the central axis. In other words, the width is measured such that the minimum distance within the given length of the axially symmetric region 12 is determined.

In the present process, the growth velocity, v, and the average axial temperature gradient, $G_0$ (over the temperature range of solidification (i.e., about 1410° C.) to a temperature greater than 1300° C. (i.e., at least about 1325° C., at least about 1350° C. or even at least about 1375° C.)), are typically controlled such that the ratio $v/G_0$ ranges in value from about 0.5 to about 2.5 times the critical value of $v/G_0$ (i.e., about $1 \times 10^{-5}$ cm$^2$/sK to about $5 \times 10^{-5}$ cm$^2$/sK based upon currently available information for the critical value of $v/G_0$). However, in some embodiments the ratio $v/G_0$ will range in value from about 0.6 to about 1.5 times the critical value of $v/G_0$ (i.e., about $1.3 \times 10^{-5}$ cm$^2$/sK to about $3 \times 10^{-5}$ cm$^2$/sK based upon currently available information for the critical value of $v/G_0$), or even from about 0.75 to about 1 times the critical value of $v/G_0$ (i.e., about $1.6 \times 10^{-5}$ cm$^2$/sK to about $2 \times 10^{-5}$ cm$^2$/sK based upon currently available information for the critical value of $v/G_0$). These ratios are achieved by independent control of the growth velocity, v, and the average axial temperature gradient, $G_0$.

In general, control of the average axial temperature gradient, $G_0$, may be achieved primarily through the design of the "hot zone" of the crystal puller, i.e. the graphite (or other materials) that makes up the heater, insulation, heat and radiation shields, among other things. Although the design particulars may vary depending upon the make and model of the crystal puller, in general, $G_0$ may be controlled using any of the means currently known in the art for controlling heat transfer at the melt/solid interface, including reflectors, insulation rings, radiation shields, purge tubes, light pipes, and heaters. In general, radial variations in $G_0$ are minimized by positioning such an apparatus within about one crystal diameter above the melt/solid interface. However, $G_0$ can be controlled further by adjusting the position of the apparatus relative to the melt (typically expresses as a distance, Hr) and/or crystal (prior to and/or during crystal growth). This is accomplished either by adjusting the position of the apparatus in the hot zone (relative to the surface of the melt, for example) or by adjusting the position of the melt surface in the hot zone (relative to the device used for controlling heat transfer, for example). The control of this distanced between the heat transfer control device and the melt surface can be achieved, for example, by means of a vision system and a method for measuring the melt level/position inside the crystal pulling apparatus during ingot growth as described by R. Fuerhoff and M. Banan in U.S. Pat. No. 6,171,391 (which is incorporated herein by reference).

In addition to adjusting or controlling the distance between the melt surface and a device positioned above the melt for controlling heat transfer, $G_0$ may also be controlled by, or additionally controlled by, means of adjusting the power supplied to side and/or bottom heaters within the crystal puller.

It is to be noted that any, or all, of these methods can be used during a batch Czochralski process in which melt volume is depleted during the process. It is to be further noted that such methods can be employed, in some embodiments, to render $G_0$ substantially constant over a substantial length of the constant diameter portion of the ingot (e.g., 25%, 50%, 75%, 85% or more), which in turn enables the growth velocity (generally controlled by means of the pull rate) to be substantially constant, as well (for a given target $v/G_0$ value or range of values).

After solidification, the concentration of intrinsic point defects in the crystal is preferably reduced by permitting diffusion of the intrinsic point defects, and to the extent applicable, mutual annihilation of point defects. In general, diffusion of the predominant intrinsic point defects to the lateral crystal surface will be the principal means for reduction if the ingot is vacancy or interstitial dominated from the center to the lateral surface of the ingot. If, however, the ingot contains a vacancy dominated core surrounded by an axially symmetric interstitial dominated region, such as in the present invention, the reduction will primarily be a combination of outward diffusion of interstitials to the surface and inward diffusion of interstitials to the vacancy dominated region where they are annihilated. The concentration of such intrinsic point defects may thus be suppressed to prevent an agglomeration event from occurring in the interstitial dominated region, the vacancy dominated region, or both.

The amount of time allowed for diffusion of the intrinsic point defects to the surface of the silicon, or to locations within the silicon matrix where they may recombined with a point defect of a different character (e.g., an interstitial diffusing to recombined with a vacancy), for their annihilation as the single crystal cools from the temperature of solidification to the temperature of nucleation is, in part, a function of the initial concentration of intrinsic point defects, and, in part, a function of the cooling rate through the nucleation temperature for agglomerated defects. For example, in the absence of a rapid cooling step, agglomerated defects can generally be avoided if the ingot is cooled from the solidification temperature to a temperature within about 50° C., 25° C., 15° C. or even 10° C. of the nucleation temperature over a period of (i) at least about 5 hours, preferably at least about 10 hours, and more preferably at least about 15 hours for 150 mm nominal diameter silicon crystals, (ii) at least about 5 hours, preferably at least about 10 hours, more preferably at least about 20 hours, still more preferably at least about 25 hours, and most preferably at least about 30 hours for 200 mm nominal diameter silicon crystals, (iii) at least about 20 hours, preferably at least about 40 hours, more preferably at least about 60 hours, and most preferably at least about 75 hours for silicon crystals having a nominal diameter of 300 mm or greater.

However, it is to be noted that the prevention of agglomerated defects may alternatively be achieved by a rapid cooling, or "quench cooling," process. More specifically, as an alternative to preventing agglomerated defect formation by slow cooling (in order to allow for diffusion, and thus suppression, of the intrinsic point defect concentration), a quench cooling process may be employed, wherein the ingot segment is quench-cooled through the temperature range at which agglomerated defects are nucleated. As a result, nucleation (and thus formation) of agglomerated defects is prevented.

Accordingly, for those segments of the ingot which will be rapidly cooled, the diffusion time allowed will typically be some fraction of the time noted above, with the fraction decreasing with increasing cooling rates, whereas the diffusion time allowed for those segments which are not rapidly cooled will be as described above. In some embodiments, as a percentage of the constant diameter portion of the ingot which is free of agglomerated defects, the segments which are rapidly cooled may constitute at least about 25%, 50%, 75%, 90% or even more.

The temperature at which nucleation of agglomerated defects occurs under slow-cool conditions is dependant upon the concentration and type of predominant intrinsic point defects (vacancy or silicon self-interstitial). In general, the nucleation temperature increases with increasing concentration of intrinsic point defects. In addition, the range of nucleation temperatures for agglomerated vacancy-type defects is somewhat greater than the range of nucleation temperatures for agglomerated interstitial-type defects. Accordingly, for some embodiments of the present process, given the range of silicon self-interstitial or vacancy concentrations typically produced in Czochralski-grown single crystal silicon: (i) the nucleation temperature for agglomerated vacancy defects is generally between about 1,000° C. and about 1,200° C., or between about 1,000° C. and about 1,100° C.; whereas, (ii) the nucleation temperature for agglomerated interstitial defects is generally between about 850° C. and about 1,100° C., or between about 870° C. and about 970° C.

In one approach of the present invention, the ingot is rapidly cooled over the entire range of temperatures at which the predominant intrinsic point defects nucleate to form agglomerated defects. In another approach, an estimate of the temperature at which nucleation of the predominant intrinsic point defects occurs is experimentally or otherwise determined and the ingot is rapidly cooled over a range of temperatures extending from temperatures of 10° C., 15° C., 25° C., 50° C. or more in excess of the determined nucleation temperature to temperatures of 10° C., 15° C., 25° C., 50° C. or more below the determined nucleation temperature. For example, under certain conditions it has been experimentally determined that the nucleation temperature is typically about 1,050° C. for vacancy dominated silicon and about 920° C. for silicon self-interstitial dominated silicon. Under these conditions, therefore, it is generally preferred that the ingot be rapidly cooled over the range of temperatures of 1,050±10° C., 1,050±15° C., 1,050±25° C., 1,050±50° C. or more for vacancy dominated silicon and that the ingot be rapidly cooled over the range of temperatures of 920±10° C., 920±15° C., 920±25° C., 920±50 ° C. or more for self-interstitial dominated silicon.

The temperature at which nucleation of the predominant intrinsic point defects occurs can be experimentally determined for a given crystal puller and process as follows. It is believed that silicon self-interstitials in a defined region of the ingot remain as point defects and do not nucleate to form agglomerated defects until that region passes through the section of the hot zone where the silicon reaches the temperature of nucleation. That is, under typical Czochralski growth conditions, the region is originally formed at the solid/liquid interface and has a temperature of approximately the melt temperature of silicon. As the region is pulled away from the melt during the growth of the remainder of the ingot the temperature of the region cools as it is pulled through the hot zone of the crystal puller. The hot zone of a particular crystal puller typically has a characteristic temperature profile, generally decreasing with increasing distances from the melt solid interface, such that at any given point in time, the region will be at a temperature approximately equal to the temperature of the section of the hot zone occupied by the region. Accordingly, the rate at which the region is pulled through the hot zone affects the rate at which the region cools. Accordingly, an abrupt change in the pull rate will cause an abrupt change in the cooling rate throughout the ingot. Significantly, the rate at which a particular region of the ingot passes through the temperature of nucleation affects both the size and density of agglomerated defects formed in the region. Thus, the region of the ingot which is passing through the nucleation temperature at the time the abrupt change is made will exhibit an abrupt variation in the size and density of agglomerated intrinsic point defects, hereinafter referred to as a nucleation front. Because the nucleation front is formed at the time the pull rate is varied, the precise location of the nucleation front along the axis of the ingot can be compared to the position of the ingot and correspondingly the nucleation front within the hot zone at the time the abrupt change in pull rate was made and compared with the temperature profile of the hot zone to determine the temperature at which the nucleation of agglomerated intrinsic point defects occurs for the type and concentration of intrinsic point defects in the location of the nucleation front.

Thus, persons skilled in the art can grow a silicon ingot by the Czochralski method under process conditions designed to produce an ingot which is either vacancy rich or silicon self-interstitial rich and, by making abrupt changes in the pull rate, by noting the position of the ingot with respect to the temperature profile in the hot zone at the point in time in which the pull rate is changed, and by observing the axial location of the nucleation front, an approximation can be made as to the temperature of nucleation for the concentration of intrinsic point defects present along the nucleation front. Additionally, since the temperature and intrinsic point defect concentration varies radially along the nucleation front, the temperature and intrinsic point defect concentration can be determined at several points along the nucleation front and the temperature of nucleation can be plotted against the intrinsic point defect concentration to determine the temperature of nucleation as a function of intrinsic point defect concentration. The temperature of the silicon along the nucleation front can be determined using any thermal simulation method known in the art which is capable of estimating the temperature at any location within a Czochralski reactor, such as for example, the thermal simulation described in Virzi, "Computer Modeling of Heat Transfer in Czochralski Silicon Crystal Growth," *Journal of Crystal Growth*, vol. 112, p. 699 (1991). The concentration of silicon self-interstitials may be estimated along the nucleation front using any point defect simulation method known in the art which is capable of estimating the concentration of intrinsic point defects at any point in the ingot, such as for example, the point defect simulation described in Sinno et al., "Point Defect Dynamics and the Oxidation-Induced Stacking-Fault Ring in Czochralski-Grown Silicon Crystals," *Journal of Electrochemical Society*. vol. 145, p. 302 (1998). Finally, the temperature of nucleation versus intrinsic point defect concentration can be obtained for an expanded range of temperatures and concentration by growing additional ingots under varying growth parameters to produce ingots with increased or decreased initial concentrations of intrinsic point defects, and repeating the cooling experiment and analysis described above.

In one approach, the single crystal silicon is preferably cooled through the nucleation temperature as rapidly as possible without fracturing the single crystal ingot. The cooling rate through this temperature is, therefore, preferably at least 5° C./min., more preferably at least about 10° C./min., more preferably at least about 15° C./min., still more preferably at least about 20° C./min., still more preferably at least about 30° C./min., still more preferably at least about 40° C./min., and still more preferably at least about 50° C./min.

In general, the single crystal silicon may be cooled through the nucleation temperature for agglomerated intrinsic point defects by means of at least two alternative approaches. In the first approach, the entire ingot (or at least those portions which are desired to be free of agglomerated A-type interstitial defects, and optionally vacancy defects) are maintained at a temperature in excess of the nucleation temperature until the ingot tail is completed; the ingot is then detached from the melt, the heat input to the hot zone is shut down, and the single crystal silicon is moved from the hot zone of the Czochralski reactor to a chamber separate from the hot zone, such as a crystal receiving or other cooling chamber to quench cool the entire crystal (or at least those portions which are desired to be free of agglomerated A-defects, and optionally vacancy defects). The cooling chamber may be jacketed with a heat exchanging device designed to utilize a cooling medium, for example cooling water, to remove heat from the cooling chamber at a rate sufficient to cool the single crystal silicon ingot at the desired rate, without directly contacting the single crystal silicon to the cooling medium. Alternatively, or in addition to using cooling jacket, a pre-cooled gas such as, for example, helium may be used to continuously purge the crystal receiving or other cooling chamber to facilitate more rapid cooling. Methods for removing heat from a process vessel are well know in the art, such that persons skilled in the art could employ a variety of means for removing heat from the crystal receiving or other cooling chamber without requiring undue experimentation.

In a second approach, a portion, preferably a large portion, of the ingot is quenched during crystal growth. In this approach, the hot zone of the crystal puller is designed to (i) achieve a desired value (or range of values) for $v/G_0$ across the entire radius of the growing crystal, (ii) provide adequate diffusion of intrinsic point defects at temperatures intermediate of the temperature of solidification and the nucleation temperature for agglomerated intrinsic point defects, and (iii) quench cool the ingot through the nucleation temperature for agglomerated intrinsic point defects of the type which predominate in the grown crystal by applying a steep axial temperature gradient over a range of temperatures containing the nucleation temperature.

Regardless of the approach, the ingot may optionally contain, in addition to the rapidly cooled segment, at least one other segment in which agglomeration reactions are avoided (in an axially symmetric region) simply by controlling the initial concentration of intrinsic point defects, and optionally allowing adequate time for diffusion prior to reaching the nucleation temperature therein (as described above).

As further described elsewhere herein, it is to be noted that, regardless of the manner employed for cooling to avoid the formation of agglomerated intrinsic point defects (in one or both axially symmetric regions), controlled cooling may additionally be needed to avoid the formation of nuclei which lead to the formation of oxidation induced stacking faults. More specifically, as noted above, the rate of cooling, as well as the temperature range over which controlled cooling must be achieved, in order to avoid the formation of agglomerated intrinsic point defects, is at least in part dependent upon the concentration of intrinsic point defects. In some instances, this concentration may be such that controlled cooling (either slow cooling, to allow for outdiffusion, or quench cooling to avoid nucleation) need only occur over a temperature range down to about 1100° C., 1050° C. or even 1000° C. In such instanced, as further described herein, cooling will also be controlled to avoid the formation of nuclei which lead to the formation of oxidation induced stacking faults (typically over a temperature range of from less than about 1100° C. to greater than about 700° C., from about 1050° C. to about 750° C., or from about 1000° C. to about 800° C.). However, in those instances wherein quench cooling is employed to temperatures below about 900° C., 850° C., 800° C., or even 750° C., formation of such nuclei may be avoided at the same time; that is, depending upon the oxygen content and intrinsic point defect content of the silicon, the silicon may be quenched through a temperature range which is sufficient to avoid both nucleation of agglomerated intrinsic point defects and well as the nucleation (and thus the formation of) oxidation induced stacking fault nuclei.

A-Type and B-Type
Interstitial Defects

In one embodiment of the present invention, the cooled ingot may contain B-defects, a type of defect which forms in interstitial dominated material. While the precise nature and mechanism for the formation of B-defects is not known, it has become generally accepted that B-defects are agglomerations of silicon self-interstitials which are not dislocation loops. B-defects are smaller than A-defects (an agglomerated interstitial defect) and are generally thought not to be dislocation loops, but rather to be three dimensional agglomerations which have either not grown large enough or not reached a sufficient activation energy necessary to form dislocation loops. At this point, it is not yet clear that B-defects when present in an active electronic device region would negatively impact the performance of that device.

In any event, it has been discovered that B-defects can be readily dissolved by slicing the ingot into wafers and heat-treating the wafers, provided the B-defects have not previously been stabilized. In one approach, therefore, wafers containing unstabilized B-defects are placed in a rapid thermal annealer and the wafer is rapidly heated to a target temperature (at which the B-defects begin to dissolve) and annealed at that temperature for a relatively short period of time. In general, the target temperature is preferably at least about 1050° C., more preferably at least about 1100° C., more preferably at least about 1150° C., still more preferably at least about 1200° C., and most preferably at least about 1250° C. The wafer will generally be held at this temperature for a period of time which depends, in part, upon the target temperature with greater times being required for lesser temperatures. In general, however, the wafer will be held at the target temperature for at least several seconds (e.g., at least 3), preferably for several tens of seconds (e.g., 10, 20, 30, 40, or 50 seconds) and, depending upon the desired characteristics of the wafer and the target temperature, for a period which may range up to about 60 seconds (which is near the limit for commercially available rapid thermal annealers).

Heat-treatments at lesser temperatures for extended periods appear to stabilize B-defects. For example, annealing silicon containing B-defects at 900° C. for a period of four hours can stabilize the B-defects such that they are incapable of being dissolved by heat-treatments not in excess of about 1250° C. Thus, the temperature of the wafer is ramped up to the target temperature relatively rapidly (e.g., at a rate of about 25° C./sec. or more) to avoid stabilizing the defects; this can be accomplished in a rapid thermal annealer in a matter of seconds.

If desired, the heat-treatment can be carried out in a manner which also enables the dissolution of nuclei which lead to the formation of oxidation induced stacking faults (as further described here), and/or the formation of a denuded zone in the near surface region of the wafer and micro defects in the bulk of the wafer. Such a process is carried out in a rapid thermal annealer and the wafers are rapidly heated to a target temperature and annealed at that temperature for a relatively short period of time. In general, the wafer is subjected to a temperature in excess of 1150° C., preferably at least 1175° C., more preferably at least about 1200° C., and most preferably between about 1200° C. and 1275° C. This rapid thermal annealing step may be carried out in the presence of a nitriding atmosphere or non-nitriding atmosphere. Nitriding atmospheres include nitrogen gas ($N_2$) or a nitrogen-containing compound gas such as ammonia which is capable of nitriding an exposed silicon surface. Suitable non-nitriding atmospheres include argon, helium, neon, carbon dioxide, and other such non-oxidizing, non-nitriding elemental and compound gases, or mixtures of such gases. The wafer will generally be maintained at this temperature for at least one second, typically for at least several seconds (e.g., at least 3), preferably for several tens of seconds (e.g., 20, 30, 40, or 50 seconds) and, depending upon the desired characteristics of the wafer, for a period which may range up to about 60 seconds (which is near the limit for commercially available rapid thermal annealers).

Upon completion of heat-treatment step, the wafer can be rapidly cooled through the range of temperatures at which crystal lattice vacancies are relatively mobile in the single crystal silicon. In general, the average cooling rate within this range of temperatures is at least about 5° C. per second and preferably at least about 20° C. per second. Depending upon the desired depth of the denuded zone, the average cooling rate may preferably be at least about 50° C. per second, still more preferably at least about 100° C. per second, with cooling rates in the range of about 100° C. to about 200° C. per second being presently preferred for some applications. Once the wafer is cooled to a temperature outside the range of temperatures at which crystal lattice vacancies are relatively mobile in the single crystal silicon, in some instances the cooling rate does not appear to significantly influence the precipitating characteristics of the wafer and thus, does not appear to be narrowly critical.

Conveniently, the cooling step may be carried out in the same atmosphere in which the heating step is carried out. The ambient preferably has no more than a relatively small partial pressure of oxygen, water vapor, and other oxidizing gases. While the lower limit of oxidizing gas concentration has not been precisely determined, it has been demonstrated that for partial pressures of oxygen of 0.01 atmospheres (atm.), or 10,000 parts per million atomic (ppma), no increase in vacancy concentration and no effect is observed. Thus, it is preferred that the atmosphere have a partial pressure of oxygen and other oxidizing gases of less than 0.01 atm. (10,000 ppma); more preferably the partial pressure of these gases in the atmosphere is no more than about 0.005 atm. (5,000 ppma), more preferably no more than about 0.002 atm. (2,000 ppma), and most preferably no more than about 0.001 atm. (1,000 ppma).

It is to be noted that the process of the present invention is in part directed to the avoidance of agglomerated defects which are known to impact the yield potential of the silicon material in the production of complex and highly integrated circuits, such agglomerated defects including agglomerated vacancy defects (e.g., D-defects) and A-defects which cannot be readily dissolved throughout the silicon wafer by a heat-treatment of the type which may be used to dissolve B-defects. Because B-defects can be readily dissolved and may not be deleterious in any event, in one embodiment the process of the present invention includes the preparation of single crystal silicon having an axially symmetric region which includes B-defects but is otherwise substantially free of agglomerated defects. In this instance, B-defects may be treated as if they are not an agglomerated intrinsic point defect. To the extent it is desired, however, that the single crystal silicon be substantially free of all agglomerated defects, including B-defects, the process includes the additional step of annealing wafers sliced from the B-defect containing ingot to eliminate them.

Vacancy-Dominated, Axially Symmetric Region:

As described above, generally speaking the process of the present invention enables the formation of segment of a single crystal silicon ingot wherein a V/I boundary is present; that is, the present invention enables the preparation of a single crystal silicon ingot segment having an interstitial-dominated, axially symmetric region extending radial inward from the lateral surface of the ingot which is substantially defect free, and a vacancy-dominated, axially symmetric region extending radially inward from the interstitial-dominated region (which may optionally be substantially defect free). Accordingly, as the radial width of the interstitial-dominated region increases, the radial width of the vacancy-dominated region decreases, and vice versa (the combined radial width of the two regions being essentially equal to the radius of the ingot). As a result, the radial width of the vacancy-dominated region may in some instances be at least about 5%, 10% or 20% of the radius of the ingot, with widths of about 30%, 40%, 60%, 80% or 90% being possible. Furthermore, this axially symmetric region can extend over a length of at least about 10% or 20% of the constant diameter portion of the ingot, with lengths of at least about 30%, 40%, 60%, 80%, 90%, 95% or even about 100% being possible.

Furthermore, it is to be noted that, generally speaking, the processes described herein for control of the formation of agglomerated interstitial defects may in some instances also be employed to avoid the formation of agglomerated vacancy defects in the vacancy-dominated region, as well.

Oxidation-Induced Stacking Faults

With respect to the vacancy-dominate region, it is also to be noted that, as has previously been reported (see, e.g., U.S. Pat. Nos. 5,919,302 and 6,254,672, as well as PCT Patent Application Serial Nos. PCT/US98/07356 and PCT/US98/07304, all of which are incorporated herein by reference), oxygen induced stacking faults and bands of enhanced oxygen clustering typically occur just inside the V/I boundary and, as the oxygen content increases, these become more pronounced. Without being held to any particular theory, it is generally believed that the formation or nucleation of the nuclei which, when exposed to suitable thermal conditions, may lead to the formation of oxidation induced stacking faults, occurs over a temperature range of from less than about 1100° C. (e.g., about 1050° C. or even 1000° C.) to greater than about 800° C. (e.g., about 850° C. or even 900° C.), the precise temperature at which nucleation occurs varying with the oxygen concentration; that is, nucleation may occur over a temperature range of rom about 800° C. to about 1100° C., from about 850° C. to about 1050° C., or from about 900° C. to about 1000° C., depending upon the oxygen content of the single crystal silicon ingot (nucleation for higher concentrations generally occurring at higher temperatures and vice versa).

Much like the process of agglomerated intrinsic point defect formation, once nucleation occurs, growth of these OISF nuclei will continue as long as the temperature is sufficiently high for oxygen to diffuse through the crystal lattice to these nucleation sites, which act as "sinks," for the oxygen. Generally speaking, such diffusion continues to occur within a commercially practical period of time until a temperature greater than about 700° C. (e.g., 750° C., 775° C., 800° C.) is reached. Accordingly, control of the cooling rate over a temperature range bound at the upper end by nucleation of OISF nuclei and the lower end by oxygen mobility enables the number and size of these nuclei to be limited (rapid cooling resulting in smaller nuclei, given that less time is allowed for diffusion and therefore growth, and possibly fewer or essentially no nuclei, if the ingot segment is "quenched" through the nucleation temperature here).

As noted above, in some instances, a quench process may be employed to prevent both the formation of agglomerated intrinsic point defects as well as the formation of nuclei which lead to the formation of oxidation induced stacking faults. However, in those instances wherein this is not achieved, such as wherein (i) slow cooling is employed to allow for diffusion of intrinsic point defects (to suppress intrinsic point defect concentrations below critical supersaturation) down to a temperature of about 1100° C. or 1050° C., for example, or (ii) quench cooling is employed, but through a temperature range which does not overlap, or sufficiently overlap, with the temperature range for nucleation of OISF nuclei, an additional cooling step is employed to control formation of OISF nuclei.

Generally speaking, this additional cooling step involves cooling the ingot segment through the temperature range described above (e.g., from about 1100° C. to about 700° C., from about 1050° C. to about 750° C., or from about 1000° C. to about 800° C.), at a rate which is sufficient to limit the formation of OISF nuclei, such that a wafer, obtained from this ingot segment, upon being subject to conditions sufficient for the formation of oxidation induced stacking faults, will have an OISF concentration of less than about $50/cm^2$, preferably less than about $40/cm^2$, more preferably less than about $30/cm^2$, and still more preferably less than about $20/cm^2$ (e.g., less than about $15/cm^2$ or even $10/cm^2$). Most preferably, however, formation of OISF nuclei is sufficiently limited or controlled, such that a wafer obtained from the ingot segment is substantially free of oxidation induced stacking faults.

It is to be noted that, as used herein, "substantially free of oxidation induced stacking faults," as well as variations thereof, refers to a concentration which is less than the current detection limits of such defects (e.g., less than about $5/cm^2$ or even about $3/cm^2$), by means common in the art.

It is to be further noted that, while the precise conditions which are sufficient to lead to the formation of oxidation induced stacking faults may vary from one wafer sample to another, the conditions for this thermal oxidation process are generally known in the art, typically involving heating the wafer for a period of time (e.g., about 1 hour, 2 hours, 4 hours, 8 hours, 10 hours or more) at a temperature in the range of 900° C. and 1200° C. in dry oxygen, wet oxygen or steam. For example, even a common oxygen precipitation heat treatment, which consists essentially of annealing a wafer at about 800° C. for about 4 hours, and then at about 1000° C. for about 16 hours, can result in the formation of such faults.

These result can typically be achieved by cooling the ingot segment through this temperature range at a rate of at least about 1° C./minute, with cooling rates of at least about 1.5° C./minute, 2° C./minute, 2.5° C./minute, 3° C./minute or more (e.g., about 5° C./minute, about 10° C./minute, or more), depending upon for example the oxygen content of the silicon. More specifically, it is to be noted in this regard that the cooling rate needed to achieve the desired result is at least in part dependent upon the oxygen concentration of the silicon. For example, typically for oxygen contents ranging from about 11 to about 14.5 PPMA (parts per million atomic, ASTM standard F-121-83), a rate of at least about 1° C./minute, 1.5° C./minute or even 2° C./minute may be needed, while for oxygen contents ranging from about 14.5 to about 18 PPMA or more, a rate of at least about 2° C./minute, 2.5° C./minute, 3° C./minute or more may be needed.

It is to be noted, however, that in some instances the wafer may be subjected to a thermal anneal prior to further processing (such as prior to being subjected to an oxidation treatment wherein oxidation induced stacking faults are formed), in order to dissolve or otherwise alter nuclei present which lead to the formation of oxidation induced stacking faults. Stated another way, the process of the present invention may additionally include a thermal anneal, after the ingot segment has been grown and a wafer obtained therefrom, prior to an oxidation treatment, in order to achieve the formation of a silicon wafer having an OISF concentration as described above.

This thermal anneal, or rapid thermal anneal, may be carried out by a number of different means described herein (see, e.g., discuss above regarding dissolution of B-defects), as well as those methods described in, for example: U.S. Pat. Nos. 5,994,761 and 6,336,968; PCT Application Serial No. PCT/US99/19301; and, PCT Application Serial No. PCT/US99/24068 (all of which are incorporated herein by reference). Generally speaking, such a treatment may involve heating the wafer to a temperature of at least about 950° C., 1000° C., 1100° C., 1200° C. or more (e.g., from about 1250° C. to about 1270° C.) for a few seconds (e.g., 2, 4, 6, 8), tens of seconds (e.g., 10, 20, 30, 40), or even several minutes, depending upon the temperature employed and the size and/or number of nuclei to be dissolved. Alternatively, however, the wafer may be rapidly heated (e.g., at a rate of at least 1° C./sec.), for example, to a temperature typically not in excess of about 1300° C. (e.g. a temperature of about 1250° C., 1225° C., or even 1200° C.), as described in, for example, U.S. Pat. No. 5,994,761.

Additional Material Features/Limitations:

Carbon Content

Substitutional carbon, when present as an impurity in single crystal silicon, has the ability to catalyze the formation of oxygen precipitate nucleation centers. For this and other reasons, therefore, it is preferred that the single crystal silicon ingot have a low concentration of carbon. That is, the concentration of carbon in the single crystal silicon is preferably less than about $5 \times 10^{16}$ atoms/$cm^3$, more preferably less than $1 \times 10^{16}$ atoms/$cm^3$, and still more preferably less than $5 \times 10^{15}$ atoms/$cm^3$, as determined by means known in the art.

Light Point Defects/Gate Oxide Integrity

The present process enables the formation of silicon wafers have significantly improved performance, including for example, a surface number of light point defects (LPDs) of a size (i.e., effective diameter) of greater than or equal to about 0.12 microns in size of less than about 75, 50, 25 or even 10 per wafer, as determined by means known in the art. In addition, the present process enables the formation of wafers having a gate oxide integrity (GOI) pass rate at least about 70% or even 75%, with rates of 80%, 85%, 90% or more being possible in some instances.

Applications

It is to be noted that wafers which are sliced from ingots grown in accordance with the present invention are suitable for use as substrates upon which an epitaxial layer may be deposited. Epitaxial deposition may be performed by means common in the art.

Wafers which are sliced from ingots grown in accordance with the present invention are also suitable for use as substrates for semiconductor on insulator structures (e.g., SIMOX or bonded applications). The semiconductor on insulator composite may be formed, for example, as described in Iyer et al., U.S. Pat. No. 5,494,849. The present wafers may be employed in such applications as the substrate wafer or the device layer.

Furthermore, it is also to be noted that wafers prepared in accordance with the present invention are suitable for use in combination with hydrogen or argon annealing treatments, such as the treatments described in European Patent Application No. 503,816 A1.

Crystal Pulling Apparatus:

It is to be noted that the process of the present invention may generally be carried out using equipment commercially available and/or designed using means common in the art.

However, one novel embodiment of a crystal pulling apparatus particularly suitable for use in the present invention will now be described herein.

Figure 3:
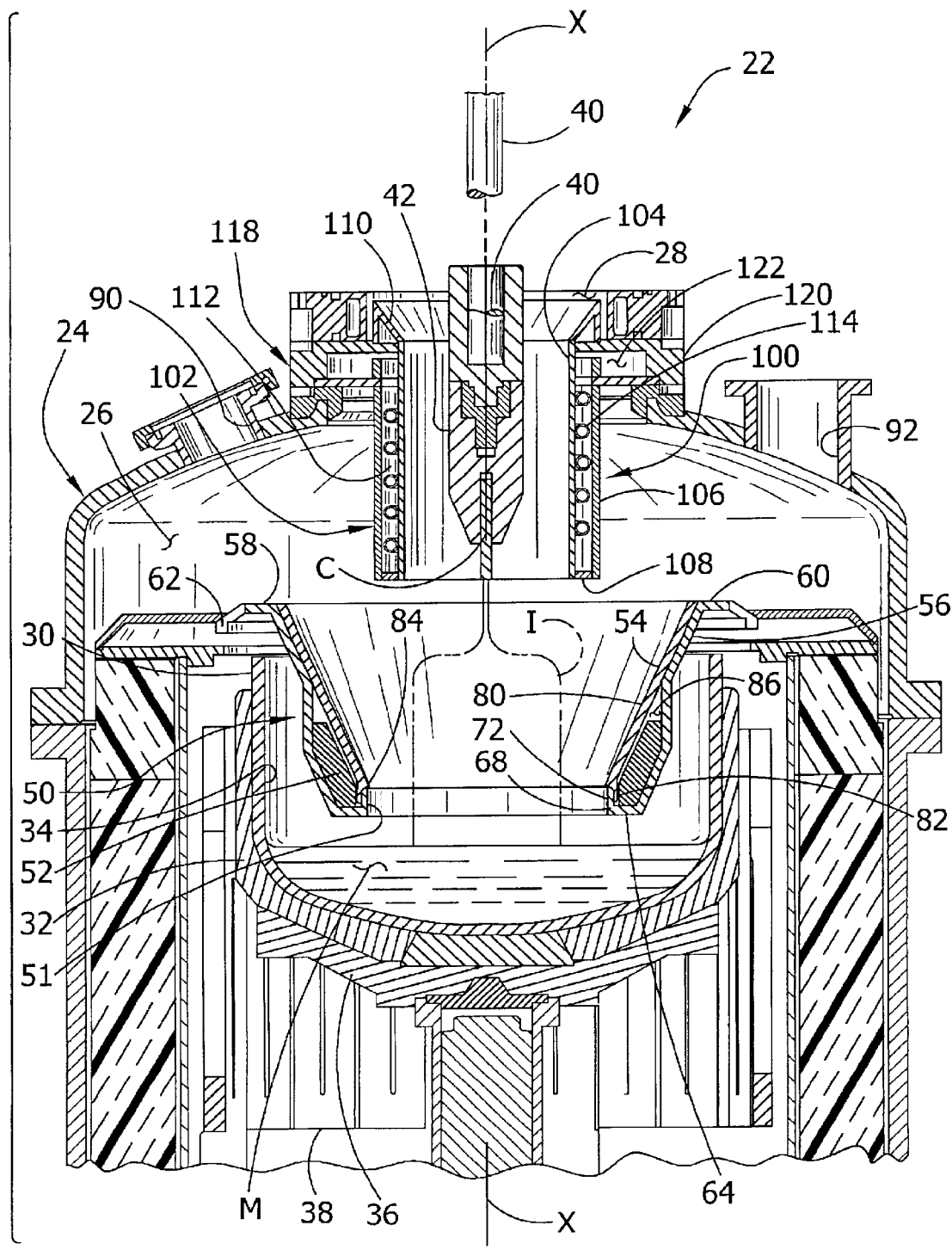
FIG. 3 is a schematic, fragmentary vertical cross-section of a crystal puller of the present invention including a heat shield assembly and a cooling system.

Referring now to the drawings and in particular to FIG. 3, a crystal puller for carrying out the method of the present invention is designated in its entirety by the reference numeral 22. The crystal puller 22 includes a water cooled housing, generally indicated at 24, for isolating an interior which includes a lower crystal growth chamber 26 and an upper pull chamber 28 having a smaller transverse dimension than the growth chamber. A quartz crucible 30 seated in a susceptor 32 has a cylindrical side wall 34 and contains molten semiconductor source material M from which the monocrystalline silicon ingot I is grown. The susceptor 32 is mounted on a turntable 36 for rotation of the susceptor and crucible 31 about a central longitudinal axis X. The crucible 30 is also capable of being raised within the growth chamber 26 to maintain the surface of the molten source material M at a generally constant level as the ingot I is grown and source material is removed from the melt. A resistance heater 38 surrounds the crucible 30 for heating the crucible to melt the source material M in the crucible. The heater 38 is controlled by an external control system (not shown) so that the temperature of the molten source material M is precisely controlled throughout the pulling process.

A pulling mechanism includes a pull shaft 40 extending down from a mechanism (not shown) capable of raising, lowering and rotating the pull shaft. The crystal puller 22 may have a pull wire (not shown) rather than a shaft 40, depending upon the type of puller. The pull shaft 40 terminates in a seed crystal chuck 42 which holds a seed crystal C used to grow the monocrystalline or single crystal silicon ingot I. The pull shaft 40 has been partially broken away in FIG. 3, both at its top and where it connects to the chuck 42. In growing the ingot I, the pulling mechanism lowers the seed crystal C until it contacts the surface of the molten source material S. Once the seed crystal C begins to melt, the pulling mechanism slowly raises the seed crystal up through the growth chamber 26 and pull chamber 28 to grow the monocrystalline ingot I. The speed at which the pulling mechanism rotates the seed crystal C and the speed at which the pulling mechanism raises the seed crystal (i.e., the pull rate v) are controlled by the external control system. The general construction and operation of the crystal puller 22, except to the extent explained more fully below, is conventional and known by those of ordinary skill in the art.

A heat shield assembly 50 is mounted in the growth chamber 26 above the molten source material M and has a central opening 51 sized and shaped to surround the ingot I as the ingot is pulled up from the source material. The heat shield assembly 50 comprises an insulating layer 52 contained between co-axially positioned inner and outer reflectors, 54 and 56 respectively. The outer reflector 56 is generally conical and has an annular flange 58 extending radially outward from a top end 60 of the reflector. The flange 58 is sized for seating over an annular support ring 62 disposed in the growth chamber 26 for supporting the heat shield assembly 50. The outer reflector 56 slopes inward and downward from the annular flange 58 and extends down into the crucible 30 to a position above the melt surface so that the outer reflector is at least partially interposed between the crucible side wall 34 and the growing ingot I. The outer reflector 56 is sloped in this manner to direct heat radiated from the crucible side wall 34 downward away from the ingot I as the ingot passes through the heat shield assembly 50 and directs convective air currents outwardly as they rise from within the crucible 30.

A second, or lower annular flange 64 extends radially inward from a bottom of the outer reflector 56 to define a bottom of the heat shield assembly 50. An annular support ledge 68 extends vertically up from the inner peripheral edge of the lower flange 64 for supporting the inner reflector 54, as will be described further below. The outer reflector 56 is preferably constructed of a graphite material, and more particularly of silicon carbide coated graphite. The outer reflector 56 has a central opening 72 defining the central opening 51 of the heat shield assembly 50.

The inner reflector 54 is also generally conical, having a tapered main portion 80 and a mounting portion 82 extending generally vertically down from the bottom of the tapered main portion of the inner reflector. As illustrated in FIG. 3, the mounting portion 82 of the inner reflector 54 includes an annular lip 84 extending generally radially inward from the top of the mounting portion for seating on the support ledge 68 of the outer reflector 56. The inner reflector 54 thus rests on the support ledge 68 of the outer reflector 56, with the bottom of the mounting portion 80 of the inner reflector being spaced slightly above the lower flange 64 of the outer reflector.

The tapered main portion 80 of the inner reflector 54 slopes upward and outward from the mounting portion 82. The top of the inner reflector 54 is generally in flush alignment with the upper flange 58 of the outer reflector 56. In the preferred embodiment, the tapered main portion 82 of the inner reflector 54 is radially spaced a small distance from the outer reflector 56 so that the only contact between the inner and outer reflectors occurs where the lip 84 of the inner reflector seats on the ledge 68 of the outer reflector. The spacing also permits expansion of the outer reflector 56 upon being heated during operation of the puller 22 without engaging and compressing the inner reflector 54. Spacing the inner reflector 54 from the outer reflector 56 in this manner reduces the amount of heat transferred from the outer reflector to the inner reflector. In the illustrated embodiment of FIG. 3, the outer reflector 56 is shaped to define an annular insulation chamber 86 between the inner and outer reflectors. The insulation 52 is constructed of a material having low thermal conductivity is contained in the insulation chamber 86 to further insulate a portion of the inner reflector 54 against heat transfer from the outer reflector 56 to the inner reflector. The inner reflector 54 is preferably constructed of the same material as the outer reflector. However, the inner and outer reflectors 54, 56 may be constructed of other similar materials without departing from the scope of this invention.

The heat shield assembly 50 shown in FIG. 3 and described above is substantially the same as that described in U.S. Pat. No. 6,197,111, which is incorporated herein by reference.

Still referring to FIG. 3, the crystal puller 22 further includes a cooling system, generally indicated at 100, mounted on the crystal puller housing 24 adjacent the bottom of the pull chamber 28 and extending down into the growth chamber 26 to above the heat shield assembly 50. The cooling system 100 comprises a cylindrical housing 102 having an inner panel 104, an outer panel 106 spaced radially outward from the inner panel in generally parallel relationship therewith, a bottom 108 and a top 110 arranged relative to each other to define an interior chamber 112. The bottom 108 of the housing 102 is sufficiently spaced above the top of the heat shield assembly 50 to permit viewing of the growing ingot I between the cooling system and the heat shield assembly via a view port 90 in the crystal puller housing 24 and to permit a feed tube (not shown, but mounted to the crystal puller housing at a feed tube port 92) to be moved there between for positioning above the crucible 30 to feed unmelted polycrystalline silicon into the crucible. As an example, the spacing between the bottom 108 of the cooling system housing 102 and the top of the heat shield assembly 50 is approximately one to two inches. A cooling tube 114 is disposed in the interior chamber 112 defined by the cooling system housing 102 and has a coil construction, with turns 116 of the cooling tube circumscribing the inner panel 104 of the housing in close contact relationship therewith. The cooling tube 114 is sized relative to the cooling system housing 102 such that the turns 116 of the cooling tube are also in close contact relationship with the outer panel 106 of the housing.

An adapter ring, generally indicated at 118, of the cooling system 100 is configured for seating on the crystal puller housing 24 generally at the bottom of the pull chamber 28 to secure the cooling system in the puller housing. The adapter ring 118 comprises a flange member 120 extending radially outward from the outer panel 106 of the cooling system housing 102 slightly below the top thereof. An annular plenum 122 extends within the flange member 120 for directing cooling fluid therethrough to cool the adapter ring 118. An opening 124 in the outer panel 106 of the cooling system housing 102 provides fluid and mechanical communication between the annular plenum 122 and the interior chamber 112 of the cooling system housing. An inlet port 126 extends from the annular plenum 122 radially outward through the flange member 120 for connection via a suitable conduit (not shown) to a source of cooling fluid (not shown), such as water, to receive cooling fluid into the cooling system 100. An outlet port 128 also extends from the annular plenum 122 radially outward through the flange member 120 for connection with a another conduit (not shown) to exhaust cooling fluid from the cooling system 100.

Figure 4:
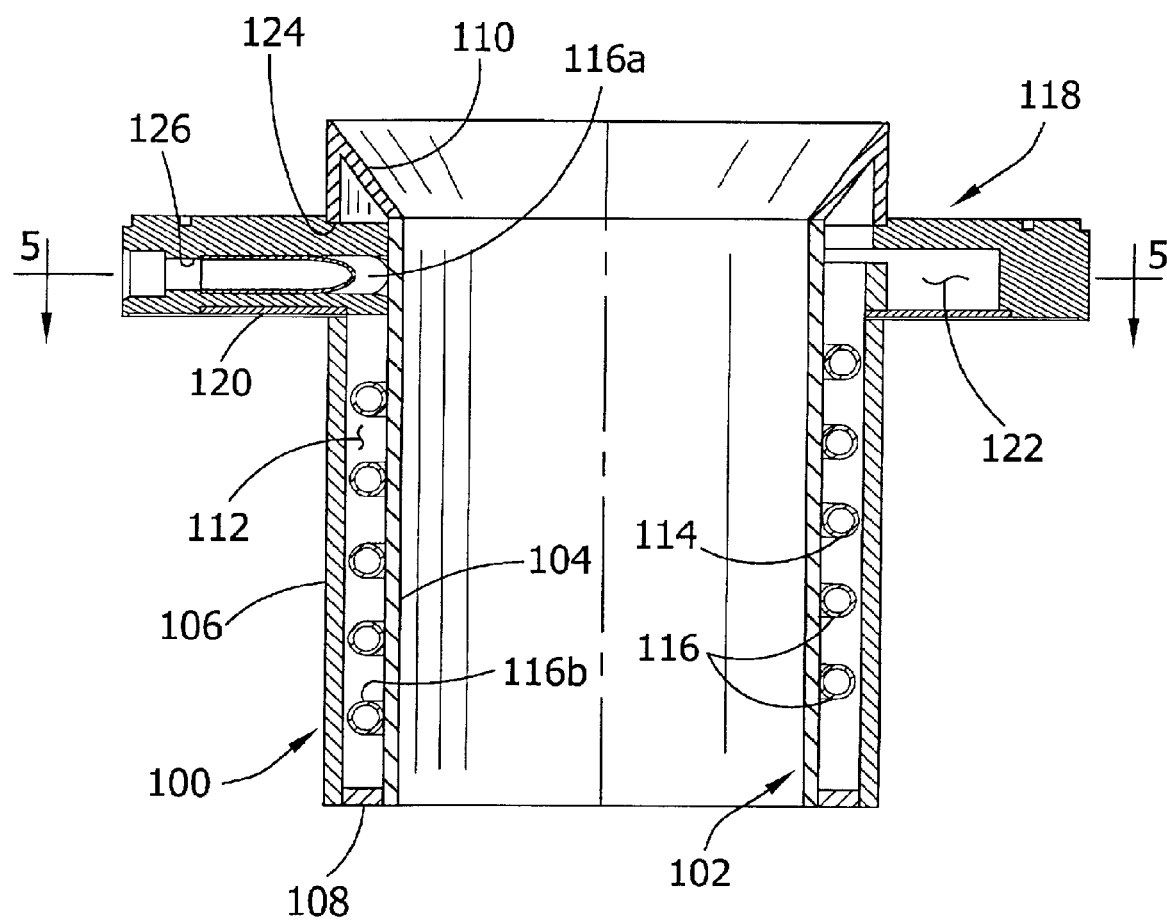
FIG. 4 is an enlarged cross-section of the cooling system of FIG. 3.
Figure 5:
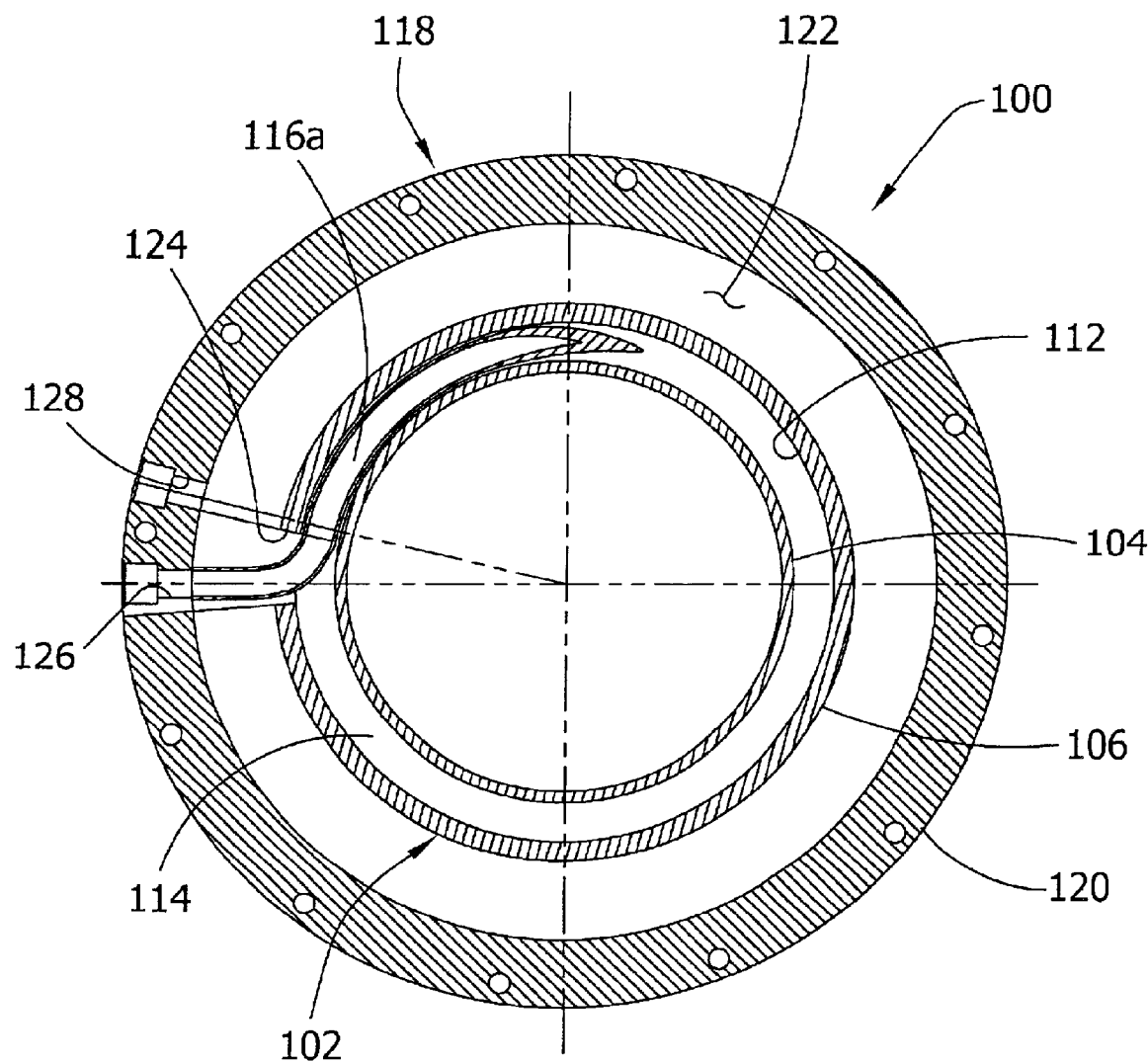
FIG. 5 is a cross-section taken in the plane of line 5—5 of FIG. 4.
Figure 6:
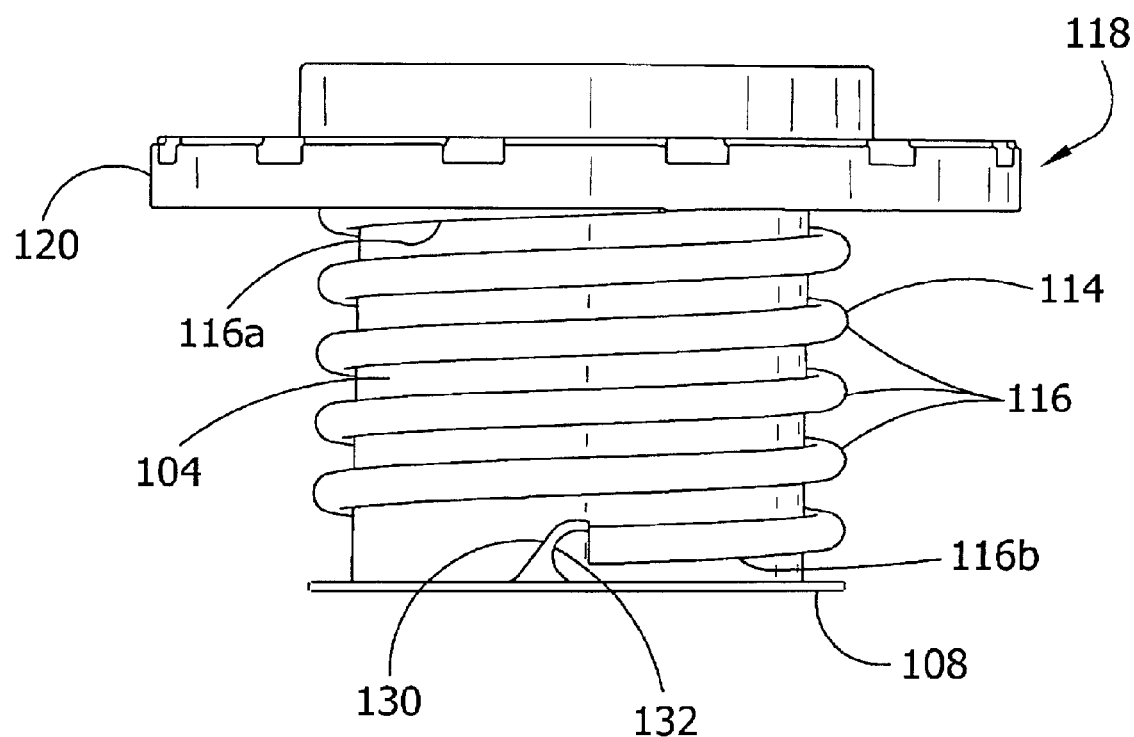
FIG. 6 is a side elevation of the cooling system of FIG. 3 with an outer panel of the cooling system omitted to reveal internal construction of the cooling system.

As illustrated in FIGS. 4 and 5, the uppermost turn 116a of the cooling tube 114 is open and is received in the inlet port 126 of the adapter ring 118 for receiving cooling fluid into the cooling tube. The turns 116 of the cooling tube 114 wind downward within the interior chamber 112 of the cooling system housing 102 to direct cooling fluid down through the cooling tube. The lowermost turn 116b of the cooling tube 114 is also open so that cooling fluid is exhausted from the cooling tube into the interior chamber 112 of the cooling system housing 102 generally at the bottom of the chamber. A baffle 130 (FIG. 6) is connected to the bottom 108 of the housing 102 within the interior chamber 112 and is configured and arranged to have a generally concave surface 132 facing the open end of the lowermost turn 116b of the cooling tube 114 to direct cooling fluid exhausted from the cooling tube to flow beneath the lowermost turn in a direction opposite the direction of the downward wind of the cooling tube.

The cooling system 100 of the illustrated embodiment, including the housing 102, the cooling tube 113 and the adapter ring 118, are constructed of steel. It is contemplated that the cooling tube 114 may be formed other than of a coil construction, such as by being formed as an annular ring (not shown) or other plenum structure (not shown) that circumscribes all or part of the inner panel 104 of the cooling system housing 102 without departing from the scope of this invention.

In a preferred method of constructing the cooling system 100, the inner panel 104, bottom 108 and top 110 of the housing 102 are connected to each other, such as by being welded together. The cooling tube 114 is wound about the inner panel 104 in close contact relationship therewith and secured to the inner panel, such as being welded thereto. The outer panel 106 is then placed around the cooling tube 114 in close contact relationship therewith, with the opening 124 in the outer panel in registry with the opening in the uppermost turn 116a of the cooling tube. The outer panel 106 is then connected to the top 110 and bottom 108 of the cooling system housing 102, such as by being welded thereto, to define the interior chamber 112 of the housing. Finally the adapter ring 118 is secured to the outer panel 106 of the cooling system housing 102, such as by being welded thereto, with the inlet port 126 of the adapter ring in fluid communication with the opening in the uppermost turn 116a of the cooling tube 114.

In operation of the cooling system 100, cooling fluid is received into the cooling system from the source of cooling fluid via the inlet port 126 of the adapter ring 118. Cooling fluid flows into the uppermost turn 116a of the cooling tube 114 and flows down through the cooling tube within the interior chamber 112 of the housing 102. With the cooling tube 114 in close contact relationship with the inner panel 104 of the housing 102, conductive heat transfer occurs between the inner panel and the cooling fluid in the cooling tube to cool the inner panel. When cooling fluid reaches the lowermost turn 116b of the cooling tube 114, it flows out of the cooling tube and is directed against the baffle 130 positioned adjacent the open end of the lowermost turn. The concave surface 132 of the baffle 130 directs the cooling fluid to flow back beneath the lowermost turn 116b of the cooling tube 114 in a direction opposite the direction that cooling fluid flows downward through the cooling tube. As a result, cooling fluid flows back up through the interior chamber 112 of the housing 102 generally within the spacing between the turns 116 of the cooling tube 114. Cooling fluid flows out from the housing 102 via the opening 124 in the outer panel 106 and then into the annular plenum 122 of the adapter ring 118. Cooling fluid is directed to flow through the annular plenum 122 until it is exhausted from the cooling system 101 through the outlet port 128 of the adapter ring 118.

Detection of Agglomerated Defects:

Agglomerated defects may be detected by a number of different techniques. For example, flow pattern defects, or D-defects, are typically detected by preferentially etching the single crystal silicon sample in a Secco etch solution for about 30 minutes, and then subjecting the sample to microscopic inspection. (see, e.g., H. Yamagishi et al., Semicond. Sci. Technol. 7, A135 (1992)). Although standard for the detection of agglomerated vacancy defects, this process may also be used to detect A-defects. When this technique is used, such defects appear as large pits on the surface of the sample when present.

Additionally, agglomerated intrinsic point defects may be visually detected by decorating these defects with a metal capable of diffusing into the single crystal silicon matrix upon the application of heat. Specifically, single crystal silicon samples, such as wafers, slugs or slabs, may be visually inspected for the presence of such defects by first coating a surface of the sample with a composition containing a metal capable of decorating these defects, such as a concentrated solution of copper nitrate. The coated sample is then heated to a temperature between about 900° C. and about 1000° C. for about 5 minutes to about 15 minutes in order to diffuse the metal into the sample. The heat treated sample is then cooled to room temperature, thus causing the metal to become critically supersaturated and precipitate at sites within the sample matrix at which defects are present.

After cooling, the sample is first subjected to a non-defect delineating etch, in order to remove surface residue and precipitants, by treating the sample with a bright etch solution for about 8 to about 12 minutes. A typical bright etch solution comprises about 55 percent nitric acid (70% solution by weight), about 20 percent hydrofluoric acid (49% solution by weight), and about 25 percent hydrochloric acid (concentrated solution).

The sample is then rinsed with deionized water and subjected to a second etching step by immersing the sample in, or treating it with, a Secco or Wright etch solution for about 35 to about 55 minutes. Typically, the sample will be etched using a Secco etch solution comprising about a 1:2 ratio of 0.15 M potassium dichromate and hydrofluoric acid (49% solution by weight). This etching step acts to reveal, or delineate, agglomerated defects which may be present.

In an alternative embodiment of this "defect decoration" process, the single crystal silicon sample is subjected to a thermal anneal prior to the application of the metal-containing composition. Typically, the sample is heated to a temperature ranging from about 850° C. to about 950° C. for about 3 hours to about 5 hours. This embodiment is particularly preferred for purposes of detecting B-type silicon self-interstitial agglomerated defects. Without being held to a particular theory, it is generally believed that this thermal treatment acts to stabilize and grow B-defects, such that they may be more easily decorated and detected.

Agglomerated vacancy defects may also be detected using laser scattering techniques, such as laser scattering tomography, which typically have a lower defect density detection limit that other etching techniques.

In general, regions of interstitial and vacancy dominated material free of agglomerated defects can be distinguished from each other and from material containing agglomerated defects by the copper decoration technique described above. Regions of defect-free interstitial dominated material contain no decorated features revealed by the etching whereas regions of defect-free vacancy dominated material (prior to a high-temperature oxygen nuclei dissolution treatment as described above) contain small etch pits due to copper decoration of the oxygen nuclei.

Detection of Oxidation Induced Stacking Faults:

The detection of oxidation induced stacking faults may be achieved by means common in the art. Generally speaking, however, this method involves the steam oxidation of a silicon wafer surface, followed by a decorative etch (e.g., Wright etch). The wafer is then inspected under a microscope (e.g., Normarski) and the stacking faults are counted.

Definitions:

As used herein, the following phrases or terms shall have the given meanings: "agglomerated intrinsic point defects" or simply "agglomerated defects" mean defects caused (i) by the reaction in which vacancies agglomerate to produce D-defects, flow pattern defects, gate oxide integrity defects, crystal originated particle defects, crystal originated light point defects, and other such vacancy related defects, or (ii) by the reaction in which self-interstitials agglomerate to produce A-defects, dislocation loops and networks, and other such self-interstitial related defects; "agglomerated interstitial defects" shall mean agglomerated intrinsic point defects caused by the reaction in which silicon self-interstitial atoms agglomerate; "agglomerated vacancy defects" shall mean agglomerated vacancy point defects caused by the reaction in which crystal lattice vacancies agglomerate; "radius" means the distance measured from a central axis to a circumferential edge of a wafer or ingot; "substantially free of agglomerated intrinsic point defects" shall mean a concentration (or size) of agglomerated defects which is less than the detection limit of these defects, which is currently about $10^3$ defects/cm$^3$; "V/I boundary" means the position along the radius (or axis) of an ingot or wafer at which the material changes from vacancy dominated to self-interstitial dominated; and "vacancy dominated" and "self-interstitial dominated" mean material in which the intrinsic point defects are predominantly vacancies or self-interstitials, respectively.

As the following Example illustrates, the present invention affords a process for preparing a single crystal silicon ingot, from which wafers may be sliced, in which, as the ingot cools from the solidification temperature in accordance with the Czochralski method, the formation of agglomeration of intrinsic point defects is prevented within an interstitial-dominated, axially symmetric region, and the formation of OISF nuclei, and optionally agglomerated defects, is prevented within a vacancy-dominated, axially symmetric region, of the constant diameter portion of the ingot.

It is to be noted that this Example is intended for illustration only, and therefore it should not be interpreted in a limiting sense.

EXAMPLE

In accordance with the present invention, a series of single crystal silicon ingots having a diameter of about 200 mm were grown in accordance with the Czochralski method, a portion of the series being grown in a crystal puller which did not possess an additional apparatus for cooling the solidified ingot and a portion being grown in a crystal pulling apparatus which did (e.g., a crystal puller having a cooling jacket positioned in the transition area of the puller, such as the one described herein). Each ingot was generally grown using the same growth conditions, such that each had a segment comprising an interstitial-dominated, axially symmetric region which was substantially free of agglomerated defects and which was concentric about a vacancy-dominated, axially symmetric region (the width of each axially symmetric region, from one ingot to the next, being approximately the same). The only significant difference between the ingots, or the ingot segments, that were grown and analyzed (in addition to the cooling mechanism described above) was the oxygen content of the silicon (oxygen contents ranging from about 13.5 to about 15.7 PPMA for the non-cooled ingots and from about 12 to about 16.8 PPMA for the cooled ingots).

Following ingot growth, the segments to be analyzed were sliced into wafers, each wafer then being subjected to a thermal anneal (wherein oxygen precipitate nuclei where stabilized and then grown), followed by an oxidation treatment to form oxidation induced stacking faults. Finally, the resulting wafers were inspected for the presence of OISF defects as described herein.

Figure 7:
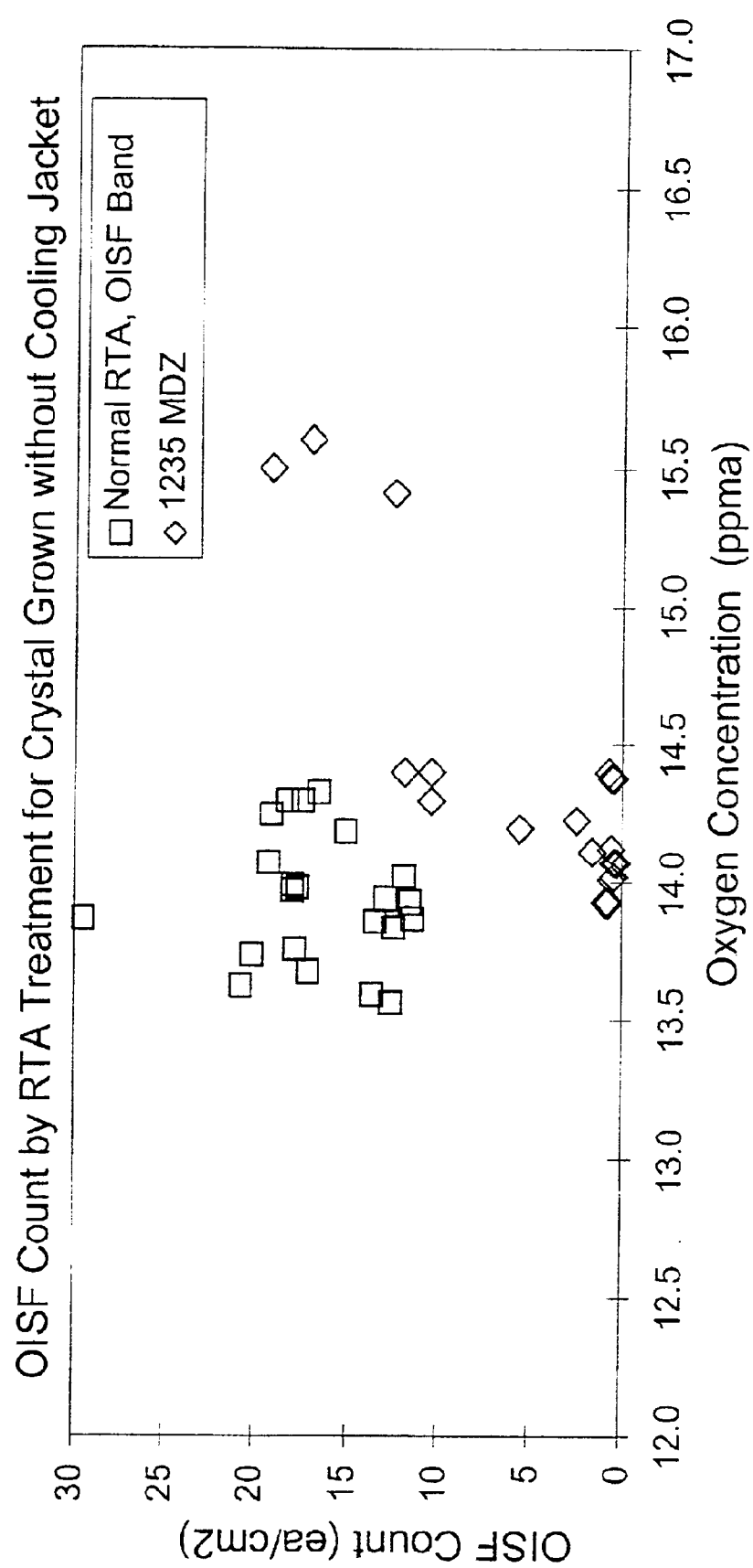
FIG. 7 is a graph showing the results, as further described in the Example below, of oxidation induced stacking faults tests of wafers which were subjected to different thermal annealing conditions and which were obtained from single crystal silicon ingots having varying oxygen contents and grown without the aid of rapid cooling (i.e., without the aid of a cooling jacket), as further described herein; and, FIG. 8 is a graph showing the results, as further described in the Example below, of oxidation induced stacking faults tests of wafers which were subjected to different thermal annealing conditions and which were obtained from single crystal silicon ingots having varying oxygen contents and grown with the aid of rapid cooling (i.e., with the aid of a cooling jacket), as further described herein.

Referring now to FIG. 7, results are provided from the wafers obtained from ingot segments derived from single crystal silicon ingots grown in a crystal puller without a cooling jacket or device, and thus without rapid cooling through the temperature range at which OISF nuclei are formed and grown. A portion of the wafers obtained were subject to a "normal" rapid thermal anneal ("RTA") treatment, wherein they were heated to about 750° C., while the remaining wafers were subjected to a RTA as described in U.S. Pat. No. 5,994,761, wherein the wafers were rapidly heated to a temperature of about 1235° C.

As can be seen from these results, absent a high temperature RTA, an OISF band is present for all oxygen concentrations above about 11 PPMA. More specifically, the results show that: (i) if a low temperature RTA is to be employed, then rapid cooling is needed to ensure OISF concentrations of less than about $10/cm^2$; (ii) if a high temperature RTA is available, slow cooling is generally acceptable for oxygen concentration up to about 14.5 PPMA, for purposes of ensuring OISF concentrations of less than about $10/cm^2$ are achieved; and, (iii) even if a high temperature RTA is available, for some preferred embodiments of the present invention (i.e., very low OISF concentrations), this is not sufficient as the oxygen concentration increases above a certain threshold(e.g., about 14 or 14.5 PPMA), absent some means by which to increase the cooling rate of the ingot segment within the key temperature range (as described above). Although still higher RTA temperatures would be more effective, there are some practical limitations with respect to the maximum temperature that can be employed (e.g., how high currently available annealers can go, as well as the maximum temperature to which the material can be subjected).

Figure 8:
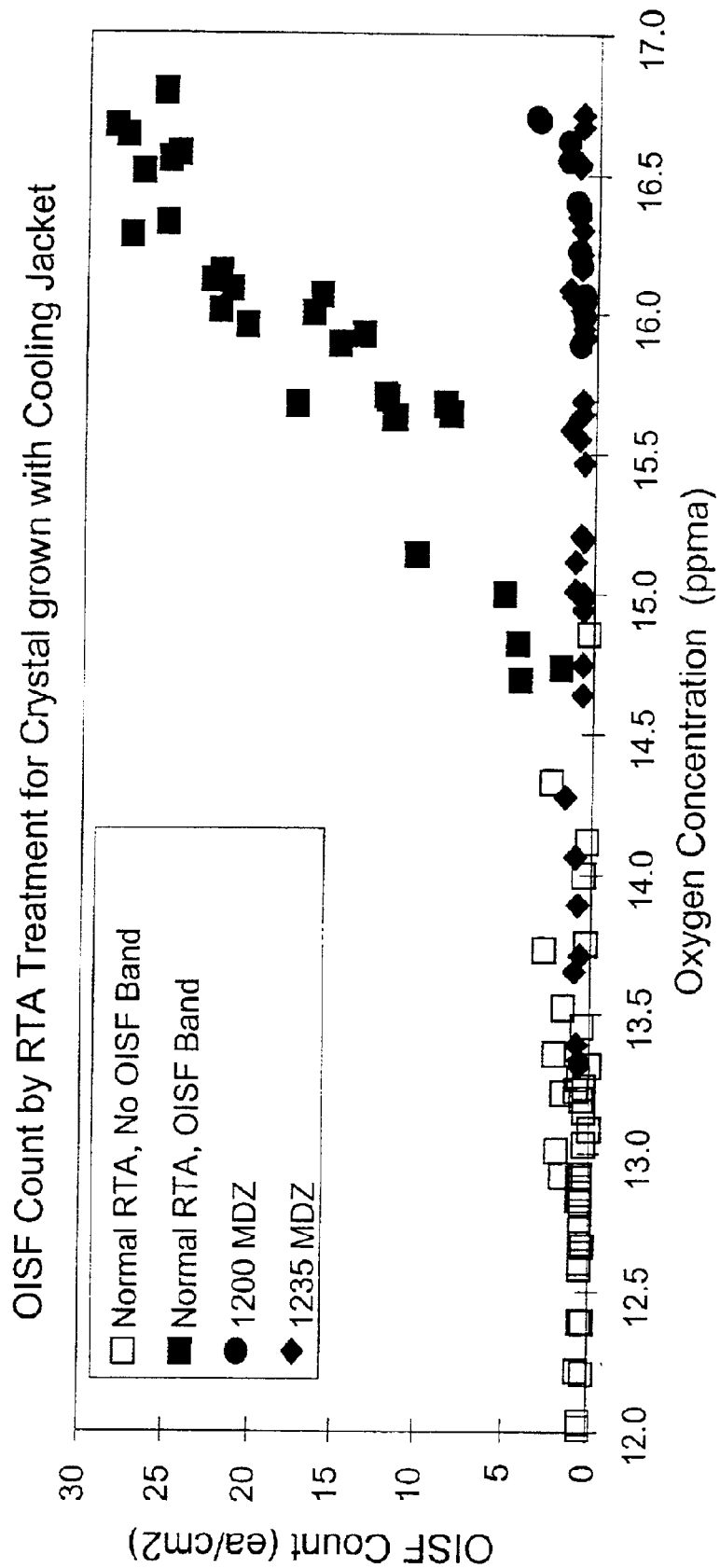

Referring now to FIG. 8, results are provided from the wafers obtained from ingot segments derived from single crystal silicon ingots grown in a crystal puller with a cooling jacket or device, and thus with rapid cooling through the temperature range at which OISF nuclei are formed and grown. A portion of the wafers obtained were then subject to a "normal" RTA treatment, wherein they were heated to about 750° C., while the remaining wafers were subjected to a RTA as described in U.S. Pat. No. 5,994,761, wherein the wafers were rapidly heated to a temperature of, in one case, about 1200° C., while in another about 1235° C.

Several observations can be made with respect to these results. Specifically: (i) using a "normal," low temperature anneal (as described above), the wafers had an OISF content of less than about $5/cm^2$, until an oxygen content of about 14.7 PPMA was reached, and an OISF content of less than about $10/cm^2$, until an oxygen content of about 15 PPMA was reached; (ii) using a RTA of about 1200° C., or 1235° C., however, enables an OISF content of less than about $5/cm^2$, or even about $3/cm^2$, to be obtained, even when the oxygen content is as high as about 16.7 PPMA.

In view of the foregoing, it can be seen that controlled cooling enables wafers having significantly lower OISF contents, but higher oxygen contents, to be obtained. Additionally, it can be seen that, even absent controlled cooling, a RTA process may be employed to reduce OISF content, thus enabling the formation of acceptable silicon having a higher oxygen content than would otherwise be possible.

What is claimed is:

1. A single crystal silicon wafer having a central axis, a front side and a back side which are generally perpendicular to the axis, a circumferential edge, and a radius extending from the central axis to the circumferential edge of the wafer, the wafer comprising:
   an interstitial-dominated, axially symmetric region extending radially inward from the circumferential edge which is substantially free of A type agglomerated interstitial defects; and,
   a vacancy-dominated, axially symmetric region extending radially inward from the interstitial-dominated region and containing agglomerated vacancy defects, wherein the concentration of agglomerated vacancy defects is greater than $10^3$ defects/$cm^3$, and further wherein, upon being subjected to an oxidation treatment, an oxidation induced stacking fault concentration is less than about $50/cm^2$.

2. The wafer of claim 1 wherein the interstitial-dominated, axially symmetric region is also substantially free of B type agglomerated defects.

3. The wafer of claim 1 wherein the wafer has a diameter of at least 150 mm.

4. The wafer of claim 1 wherein the interstitial-dominated, axially symmetric region has a radial width of about 40% of the length of the radius of the ingot.

5. The wafer of claim 1 wherein the interstitial-dominated, axially symmetric region has a radial width of about 60% of the length of the radius of the ingot.

6. The wafer of claim 1 wherein the average oxygen content of the wafer is within the range of about 11 to about 14.5 PPMA.

7. The wafer of claim 1 wherein the average oxygen content of the wafer is within the range of about 14.5 to about 18 PPMA.

8. The wafer of claim 1 wherein the oxidation induced stacking fault concentration of the wafer is less than about $40/cm^2$.

9. The wafer of claim 1 wherein the oxidation induced stacking fault concentration of the wafer is less than about $20/cm^2$.

10. The wafer of claim 1 wherein the oxidation induced stacking fault concentration of the wafer is less than about $10/cm^2$.

11. The wafer of claim 1 wherein the number of light point defects equal to or greater than about 0.12 microns in size on the wafer surface is less than about 25.

12. The wafer of claim 1 wherein the number of light point defects equal to or greater than about 0.12 microns in size on the wafer surface is less than about 10.

13. The wafer of claim 1 wherein the interstitial-dominated, axially symmetric region has a radial width of about 20% of the length of the radius of the ingot.

14. The wafer of claim 1 wherein the interstitial-dominated, axially symmetric region has a radial width of about 80% of the length of the radius of the ingot.

15. The wafer of claim 1 wherein the wafer has a diameter of at least 200 mm.

16. The wafer of claim 15 wherein the interstitial-dominated, axially symmetric region is also substantially free of B type agglomerated defects.

17. The wafer of claim 15 wherein the interstitial-dominated, axially symmetric region has a radial width of about 40% of the length of the radius of the ingot.

18. The wafer of claim 15 wherein the interstitial-dominated, axially symmetric region has a radial width of about 60% of the length of the radius of the ingot.

19. The wafer of claim 15 the average oxygen content of the wafer is within the range of about 11 to about 14.5 PPMA.

20. The wafer of claim 15 wherein the average oxygen content of the wafer is within the range of about 14.5 to about 18 PPMA.

21. The wafer of claim 15 wherein the oxidation induced stacking fault concentration of the wafer is less than about $20/cm^2$.

22. The wafer of claim 15 wherein the number of light point defects equal to or greater than about 0.12 microns in size on the wafer surface is less than about 25.

23. The wafer of claim 1 wherein the wafer has a diameter of at least 300 mm.

24. The wafer of claim 23 wherein the interstitial-dominated, axially symmetric region is also substantially free of B type agglomerated defects.

25. The wafer of claim 23 wherein the interstitial-dominated, axially symmetric region has a radial width of about 40% of the length of the radius of the ingot.

26. The wafer of claim 23 wherein the interstitial-dominated, axially symmetric region has a radial width of about 60% of the length of the radius of the ingot.

27. The wafer of claim 23 wherein the average oxygen content of the wafer is within the range of about 11 to about 14.5 PPMA.

28. The wafer of claim 23 wherein the average oxygen content of the wafer is within the range of about 14.5 to about 18 PPMA.

29. The wafer of claim 23 wherein the oxidation induced stacking fault concentration of the wafer is less than about $20/cm^2$.

30. The wafer of claim 23 wherein the number of light point defects equal to or greater than about 0.12 microns in size on the wafer surface is less than about 25.

* * * * *